(12) United States Patent
Ito et al.

(10) Patent No.: US 12,206,050 B2
(45) Date of Patent: Jan. 21, 2025

(54) SEMICONDUCTOR OPTICAL DEVICE HAVING DISTRIBUTED FEED-BACK TYPE LASER AND ELECTROABSORPTION-TYPE MODULATOR

(71) Applicant: Sumitomo Electric Industries, Ltd., Osaka (JP)

(72) Inventors: Yuki Ito, Osaka (JP); Mitsuru Ekawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 555 days.

(21) Appl. No.: 17/529,370

(22) Filed: Nov. 18, 2021

(65) Prior Publication Data

US 2022/0199866 A1 Jun. 23, 2022

(30) Foreign Application Priority Data

Dec. 18, 2020 (JP) .................................. 2020-210233

(51) Int. Cl.
*H01L 33/48* (2010.01)
*H01L 33/58* (2010.01)
*H01L 33/62* (2010.01)

(52) U.S. Cl.
CPC ............ *H01L 33/483* (2013.01); *H01L 33/58* (2013.01); *H01L 33/62* (2013.01)

(58) Field of Classification Search
CPC .................................. H01L 33/58; H01L 33/62
See application file for complete search history.

(56) References Cited

U.S. PATENT DOCUMENTS

| 6,226,310 B1* | 5/2001 | Takagi | H01S 5/0265 |
| | | | 372/50.11 |
| 2002/0158266 A1 | 10/2002 | Sato et al. | |
| 2003/0119222 A1* | 6/2003 | Pakulski | H01S 5/227 |
| | | | 438/60 |
| 2004/0048406 A1* | 3/2004 | Ikeda | H01S 5/0265 |
| | | | 257/85 |

(Continued)

FOREIGN PATENT DOCUMENTS

| JP | 08-248364 A | 9/1996 |
| JP | 11-068222 A | 3/1999 |

(Continued)

*Primary Examiner* — Jay C Chang
*Assistant Examiner* — Mikka Liu
(74) *Attorney, Agent, or Firm* — Volpe Koenig

(57) ABSTRACT

A semiconductor optical device, in which a light emitting region and a modulator region are integrated, includes a first mesa disposed in the light emitting region, protruding in a direction that intersects a light propagation direction, and including an active layer, first and second buried layers disposed on the first mesa in a direction that intersects the light propagation direction and sequentially stacked in a direction in which the first mesa protrudes, a first semiconductor layer disposed on the first mesa and the second buried layer, a second mesa disposed in the modulator region and including a light absorption layer, and a third buried layer disposed on the second mesa. The first semiconductor layer and the first buried layer each have a first conductivity type. The second buried layer has a second conductivity type different from the first conductivity type, and the third buried layer is a semi-insulating semiconductor layer.

8 Claims, 20 Drawing Sheets

(56) References Cited

U.S. PATENT DOCUMENTS

| | | | |
|---|---|---|---|
| 2010/0328753 A1 | 12/2010 | Hayashi et al. | |
| 2011/0305255 A1* | 12/2011 | Ishimura | H01S 5/12 |
| | | | 372/50.1 |
| 2013/0177037 A1* | 7/2013 | Yagi | H01S 5/0265 |
| | | | 372/50.1 |
| 2020/0274329 A1 | 8/2020 | Hokama et al. | |

FOREIGN PATENT DOCUMENTS

| | | |
|---|---|---|
| JP | 2001-274515 A | 10/2001 |
| JP | 2002-324936 A | 11/2002 |
| JP | 2011-029595 A | 2/2011 |
| WO | 2018/079112 A1 | 5/2018 |

* cited by examiner

SEMICONDUCTOR OPTICAL DEVICE HAVING DISTRIBUTED FEED-BACK TYPE LASER AND ELECTROABSORPTION-TYPE MODULATOR

CROSS REFERENCE TO RELATED APPLICATION

This application claims priority based on Japanese Patent Application No. 2020-210233, filed on Dec. 18, 2020, and the entire contents of the Japanese patent application are incorporated herein by reference.

FIELD OF THE INVENTION

The present disclosure relates to a semiconductor optical device and a method of manufacturing a semiconductor optical device.

BACKGROUND ART

A semiconductor optical device in which a semiconductor laser diode and other optical elements are integrated by a butt-joint method is known as a light source for optical communications or the like. For example, a technique of integrating a distributed feed-back type (DFB) light emitting region and an electroabsorption (EA) type optical modulator has been developed (Japanese Patent Application Laid-Open No. 2002-324936 and Japanese Patent Application Laid-Open No. 2011-29595).

SUMMARY OF THE INVENTION

A semiconductor optical device according to the present disclosure is a semiconductor optical device in which a light emitting region that emits light and a modulator region that modulates the light are integrated. The device includes a first mesa that is disposed in the light emitting region, extends in a light propagation direction in which the light propagates, protrudes in a direction intersecting the light propagation direction, and includes an active layer; a first buried layer and a second buried layer that are disposed on each of two sides of the first mesa in a direction intersecting the light propagation direction and are sequentially stacked in the direction in which the first mesa protrudes; a first semiconductor layer that is disposed on the first mesa and the second buried layer; a second mesa that is disposed in the modulator region, extends in the light propagation direction, protrudes in a direction intersecting the light propagation direction, and includes a light absorption layer; and a third buried layer that is disposed on each of two sides of the second mesa. The first semiconductor layer and the first buried layer each have a first conductivity type. The second buried layer has a second conductivity type that is different from the first conductivity type, and the third buried layer is a semi-insulating semiconductor layer.

A method of manufacturing a semiconductor optical device according to the present disclosure is a method of manufacturing a semiconductor optical device in which a light emitting region that emits light and a modulator region that modulates the light are integrated. The method includes forming a first mesa including an active layer in the light emitting region; sequentially stacking, in a direction in which the first mesa protrudes, a first buried layer and a second buried layer on each of two sides of the first mesa in a direction intersecting a light propagation direction in which the light propagates; forming a first semiconductor layer on the first mesa and the second buried layer; forming a second mesa including a light absorption layer in the modulator region; and disposing a third buried layer on each of two sides of the second mesa. In the method, the first semiconductor layer and the first buried layer each have a first conductivity type, the second buried layer has a second conductivity type different from the first conductivity type, and the third buried layer is a semi-insulating semiconductor layer.

DESCRIPTION OF EMBODIMENTS

Figure 1A:
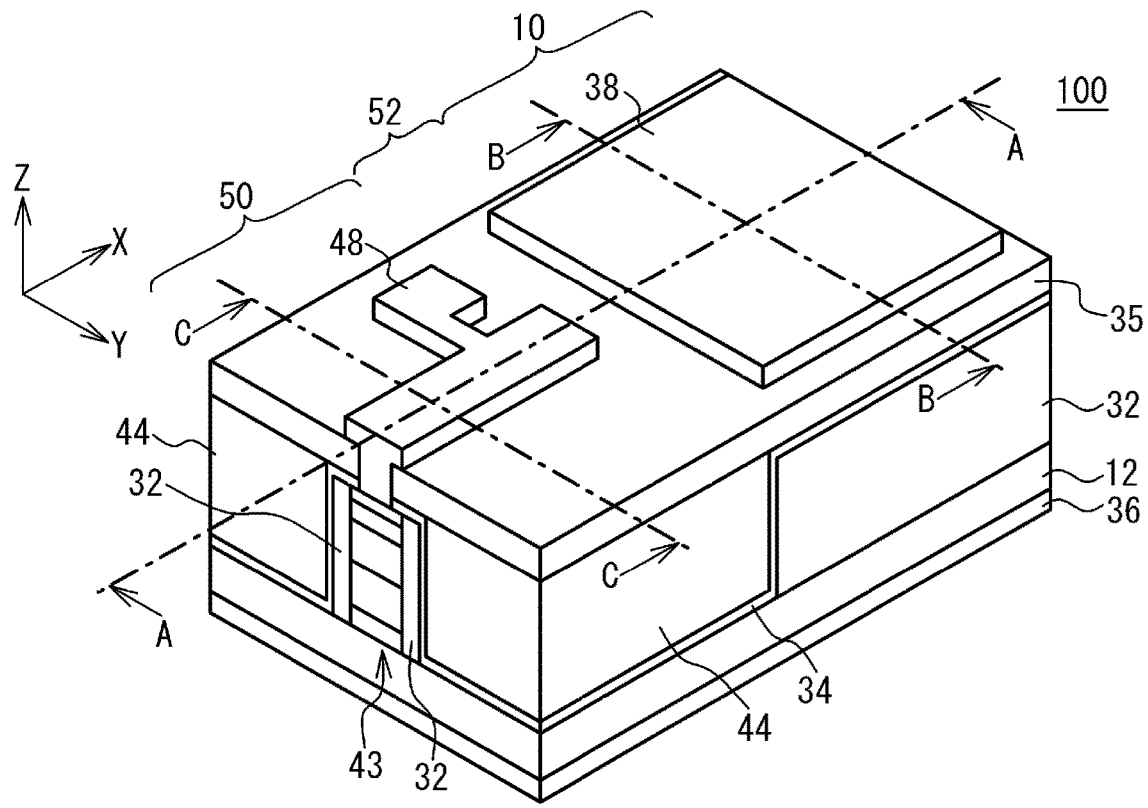
FIG. 1A is a perspective view illustrating a semiconductor optical device according to an embodiment.

A mesa including, for example, a core layer of a multi quantum well structure (MQW) is disposed in a light emitting region and a modulator region. In a semi-insulating buried hetero (SIBH) structure, the mesa is embedded with a semi-insulating semiconductor layer. Since the use of the semi-insulating buried layer reduces a capacity of the modulator region, the SIBH structure is suitable for high speed modulation. On the other hand, in the semi-insulating buried layer, current confinement in the light emitting region is insufficient, and a current leaks into the buried layer. For this reason, it is difficult to increase an optical output, and in particular, it is difficult to operate at high output under high temperatures. It is therefore an object of the present invention to provide a semiconductor optical device and a method of manufacturing the semiconductor optical device, which are capable of performing high output and high speed modulation.

First, the contents of embodiments according to the present disclosure will be listed and described.

(1) An embodiment according to the present disclosure is a semiconductor optical device in which a light emitting region that emits light and a modulator region that modulates the light are integrated. The device includes a first mesa that is disposed in the light emitting region, extends in a light propagation direction in which the light propagates, protrudes in a direction intersecting the light propagation direction, and includes an active layer; a first buried layer and a second buried layer that are disposed on each of two sides of the first mesa in a direction intersecting the light propagation direction and are sequentially stacked in the direction in which the first mesa protrudes; a first semiconductor layer that is disposed on the first mesa and the second buried layer; a second mesa that is disposed in the modulator region, extends in the light propagation direction, protrudes in a direction intersecting the light propagation direction, and includes a light absorption layer; and a third buried layer that is disposed on each of two sides of the second mesa. The first semiconductor layer and the first buried layer each have a first conductivity type. The second buried layer has a second conductivity type different from the first conductivity type, and the third buried layer is a semi-insulating semiconductor layer. By stacking the first buried layer and the second buried layer in the light emitting region, strong current confinement can be achieved. Since a current is selectively injected into the active layer, high output can be achieved. By disposing the semi-insulating third buried layer in the modulator region, a parasitic capacitance can be reduced, and high speed modulation can be achieved.

(2) The first mesa may include a second semiconductor layer and the active layer that are sequentially stacked, the second mesa may include a third semiconductor layer, the light absorption layer, and a fourth semiconductor layer that are sequentially stacked. The second semiconductor layer and the third semiconductor layer each may have the second conductivity type, and the fourth semiconductor layer may have the first conductivity type. Since the first semiconductor layer having the first conductivity type is disposed on the active layer, and the second semiconductor layer having the second conductivity type is disposed under the active layer, the current can be injected into the active layer. The first semiconductor layer having the first conductivity type is disposed on the light absorption layer, and the third semiconductor layer having the second conductivity type is disposed under the light absorption layer, so that a voltage can be applied to the light absorption layer.

(3) The semiconductor optical device may include a resin layer that is disposed on each of two sides of the second mesa and outside of the third buried layer. Since the parasitic capacitance is further reduced, higher speed modulation can be achieved.

(4) The first semiconductor layer and the first buried layer each may include p-type indium phosphide, and the second buried layer may include n-type indium phosphide. By a pn buried structure in which the p-type first buried layer and the n-type second buried layer are disposed on each of two sides of the first mesa, the current confinement can be effectively performed and the output can be increased.

(5) The third buried layer may include semi-insulating indium phosphide. The high speed modulation can be performed by reducing the parasitic capacitance using semi-insulating indium phosphide.

(6) The second mesa may include a first tapered portion tapered from the modulator region toward the light emitting region in the light propagation direction and a second tapered portion tapered from the light emitting region toward the modulator region in the light propagation direction. The first tapered portion and the second tapered portion can strengthen an optical coupling between the first mesa and the second mesa and suppress return of light or the like between the light emitting region and the modulator region.

(7) The first mesa may include a diffraction grating extending in the light propagation direction. The light emitting region functions as a DFB laser.

(8) A method of manufacturing a semiconductor optical device is a method of manufacturing a semiconductor optical device in which a light emitting region that emits light and a modulator region that modulates the light are integrated. The method includes forming a first mesa including an active layer in the light emitting region; sequentially stacking, in a direction in which the first mesa protrudes, a first buried layer and a second buried layer on each of two sides of the first mesa in a direction intersecting a light propagation direction in which the light propagates; forming a first semiconductor layer on the first mesa and the second buried layer; forming a second mesa including a light absorption layer in the modulator region; and disposing a third buried layer on each of two sides of the second mesa. In the method, the first semiconductor layer and the first buried layer each have a first conductivity type, the second buried layer has a second conductivity type different from the first conductivity type, and the third buried layer is a semi-insulating semiconductor layer. By stacking the first buried layer and the second buried layer in the light emitting region, strong current confinement can be achieved. Since the current is selectively injected into the active layer, the high output can be achieved. By disposing a semi-insulating third buried layer in the modulator region, the parasitic capacitance can be reduced, and the high speed modulation can be achieved.

(9) the forming the second mesa may be forming the second mesa having a larger width than the first mesa. The stacking the first buried layer and the second buried layer may include stacking the first buried layer and the second buried layer on each of two sides of each of the first mesa and the second mesa. The method may include removing the first buried layer and the second buried layer on each of two sides of the second mesa and narrowing the second mesa. The disposing the third buried layer may be disposing the third buried layer on each of two sides of the second mesa after the narrowing the second mesa. Since the first buried layer and the second buried layer are removed from each of two sides of the second mesa to form the third buried layer, the parasitic capacitance can be effectively reduced.

DETAILS OF EMBODIMENTS OF THE PRESENT DISCLOSURE

Specific examples of the semiconductor optical device and the method of manufacturing the semiconductor optical device according to embodiments of the present disclosure will be described below with reference to the drawings. It should be noted that the present disclosure is not limited to these examples, and is defined by claims, and is intended to embrace all the modifications within the meaning and range of equivalency of the claims.

(Semiconductor Optical Device)

Figure 1B:
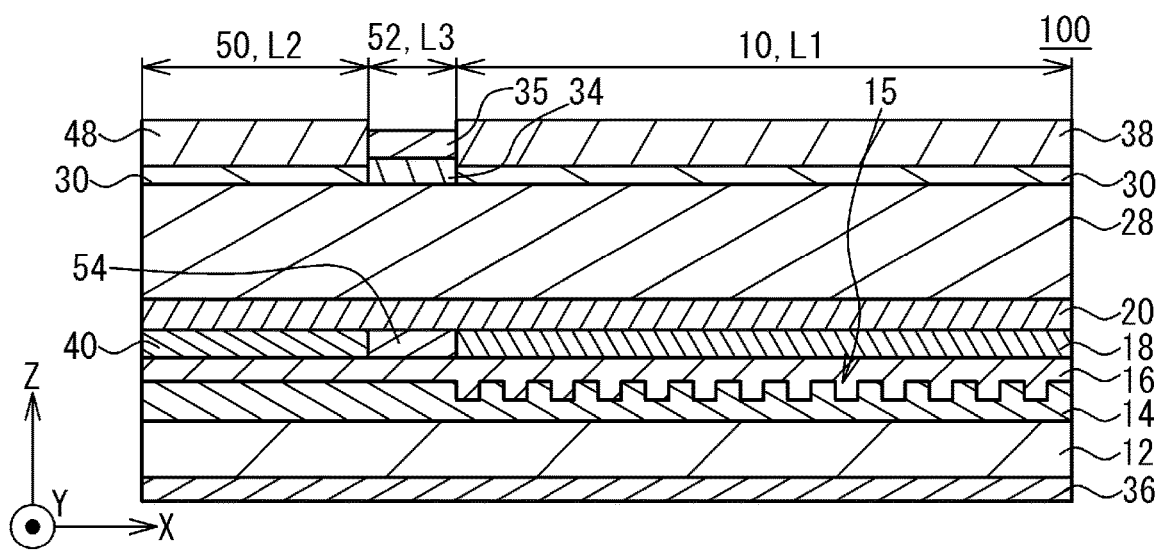
FIG. 1B is a cross-sectional view in an XZ plane taken along line A-A in FIG. 1A.
Figure 2A:
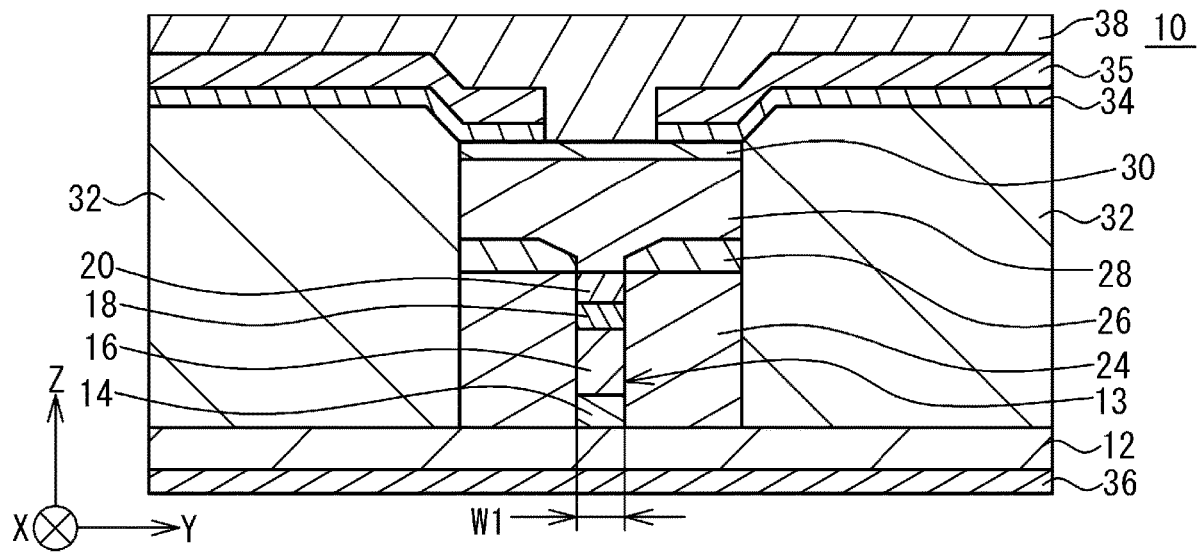
FIG. 2A is a cross-sectional view taken along line B-B in FIG. 1A.
Figure 2B:
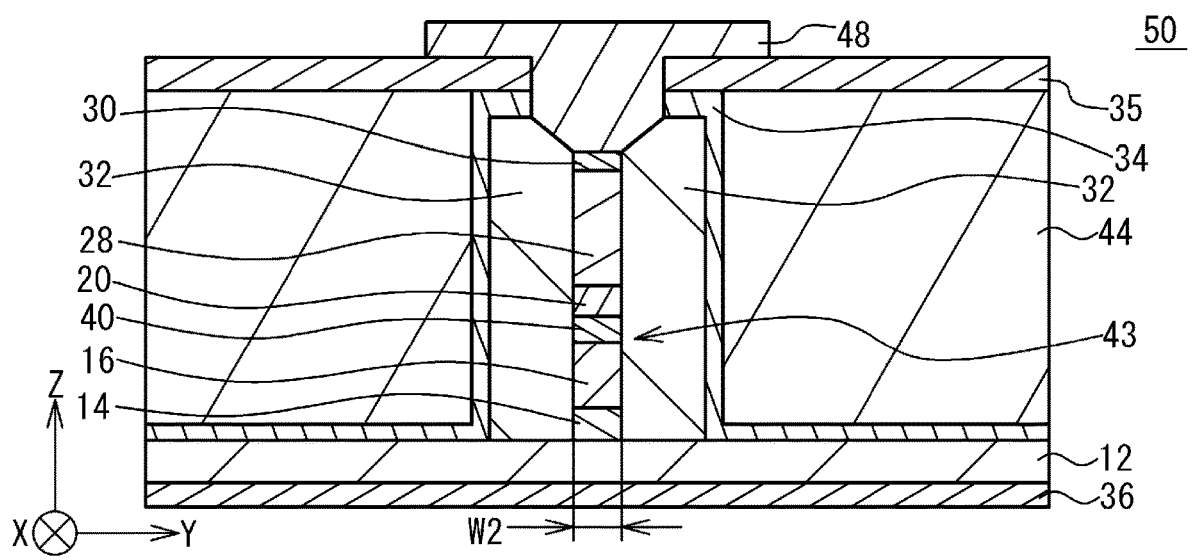
FIG. 2B is a cross-sectional view taken along line C-C in FIG. 1A.
Figure 3:
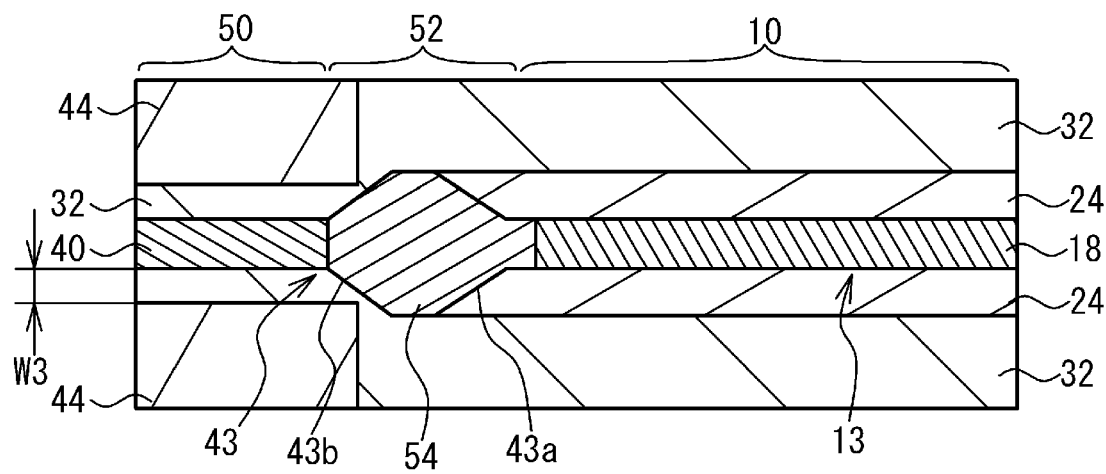
FIG. 3 is a cross-sectional view in an XY plane taken along line A-A in FIG. 1A.

FIG. 1A is a perspective view illustrating a semiconductor optical device 100 according to an embodiment. FIG. 1B is a cross-sectional view in an XZ plane taken along line A-A in FIG. 1A. FIG. 2A is a cross-sectional view taken along line B-B in FIG. 1A. FIG. 2B is a cross-sectional view taken along line C-C in FIG. 1A. An inclination that occurs in a buried layer or the like is omitted in the perspective view. FIG. 3 is a cross-sectional view in an XY plane taken along line A-A in FIG. 1A. An X-axis direction is a light propagation direction. A Z-axis direction is a stacking direction of layers and is orthogonal to the X-axis direction. A Y-axis direction is orthogonal to the X-axis direction and the Z-axis direction.

As illustrated in FIGS. 1A and 1B, semiconductor optical device 100 has a butt-joint structure including a light emitting region 10, a waveguide region 52, and a modulator region 50. Light emitting region 10, waveguide region 52, and modulator region 50 are disposed in this order in the X-axis direction. A length L1 in the X-axis direction of light emitting region 10 illustrated in FIG. 1B is, for example, 300 µm or more and 600 µm or less. A length L2 in the X-axis direction of modulator region 50 is, for example, 50 µm or more and 200 µm or less. A length L3 in the X-axis direction of waveguide region 52 is, for example, 20 µm or more and 150 µm or less.

FIG. 2A is a cross-sectional view of light emitting region 10. Light emitting region 10 functions as a distributed feed-back type (DFB) laser. In light emitting region 10, a mesa 13 (a first mesa), buried layers 24, 26 and 32, and a cladding layer 28 are disposed on a substrate 12. Mesa 13 is formed of a diffraction grating layer 14, a cladding layer 16 (a second semiconductor layer), an active layer 18, and a cladding layer 20 which are stacked in this order on an upper surface of substrate 12. Mesa 13 is located near the center of substrate 12 in the Y-axis direction, and extends in light emitting region 10 in the X-axis direction. A width W1 of mesa 13 is, for example, from 1 µm to 2 µm, inclusive.

A buried layer 24 (a first buried layer) is disposed on substrate 12 and on each of two sides of mesa 13 in the Y-axis direction. Two buried layers 24 sandwich mesa 13. A buried layer 26 (a second buried layer) is disposed on each of buried layers 24. Two buried layers 26 are spaced apart from each other and sandwich mesa 13 therebetween in the Y-axis direction. Cladding layer 28 is disposed on mesa 13 and buried layer 26, and is in contact with cladding layer 20 between two buried layers 26. A contact layer 30 is disposed on cladding layer 20.

Two buried layers 32 (third buried layers) are disposed on substrate 12 and sandwich mesa 13, buried layers 24 and 26, and cladding layer 28 in the Y-axis direction. Insulating films 34 and 35 are sequentially disposed on contact layer 30 and buried layers 32. An electrode 38 is disposed on insulating film 35 and is in contact with contact layer 30 through openings of insulating films 34 and 35 to be electrically connected to contact layer 30. Electrode 38 is formed of a metal such as a stacked body of titanium, platinum, and gold (Ti/Pt/Au). An electrode 36 is disposed on a lower surface of substrate 12 and electrically connected to substrate 12. Electrode 36 is formed of a metal such as an alloy of gold, germanium and nickel (AuGeNi).

Active layer 18 includes a plurality of well layers and barrier layers and has a multi quantum well structure (MQW). The well layers and the barrier layers are formed of, for example, undoped gallium indium arsenide phosphide (i-GaInAsP) or aluminum gallium indium arsenide (i-AlGaInAs). Diffraction grating layer 14 is formed of, for example, indium gallium arsenide phosphide (InGaAsP). Substrate 12 and cladding layer 16 are formed of, for example, n-type indium phosphide (n-InP) and function as n-type cladding layers. Buried layer 26 is formed of n-InP. An n-type dopant added to InP includes, for example, silicon (Si). Cladding layers 20 and 28 (corresponding to the first semiconductor layer), and buried layer 24 are formed of, for example, p-InP. A p-type dopant includes, for example, zinc (Zn). Buried layers 32 are formed of, for example, semi-insulating InP doped with iron (Fe). Contact layer 30 is formed of, for example, p++-type InGaAs. Insulating films 34 and 35 are formed of an insulator such as silicon oxide (SiO$_2$).

N-type cladding layer 16, active layer 18 of the MQW, p-type cladding layers 20 and 28 are stacked to form a p-i-n structure including mesa 13 in the Z-axis direction. P-type buried layer 24, n-type buried layer 26, and p-type cladding layer 28 are stacked on each of two sides of mesa 13 to form a pn buried structure.

FIG. 2B is a cross-sectional view of modulator region 50. Modulator region 50 functions as an electroabsorption (EA)-type modulator. In modulator region 50, a mesa 43 (a second mesa), buried layers 32, and resin layers 44 are disposed on substrate 12. Mesa 43 is located near the center of substrate 12 in the Y-axis direction, and extends in modulator region 50 and waveguide region 52 in the X-axis direction. In modulator region 50, mesa 43 is formed of diffraction grating layer 14, cladding layer 16 (a third semiconductor layer), a light absorption layer 40, cladding layer 20, cladding layer 28 (these two cladding layers correspond to a fourth semiconductor layer), and contact layer 30, which are stacked in this order on substrate 12. A width W2 of mesa 43 is, for example, from 1 µm to 2 µm, inclusive. Buried layer 32 is disposed on substrate 12 and on each of two sides of mesa 43. Two buried layers 32 sandwich mesa 43. As illustrated in FIG. 3, in waveguide region 52, mesa 43 has a waveguide layer 54 instead of light absorption layer 40.

Insulating film 34 covers a top surface of substrate 12, sides and top surface of buried layer 32. Resin layers 44 are disposed on insulating film 34 and outside buried layers 32. Two resin layers 44 sandwich mesa 43 and buried layers 32 in the Y-axis direction. Insulating film 35 is disposed on resin layers 44. An electrode 48 is disposed on insulating film 35. Electrode 48 is in contact with contact layer 30 through an opening of insulating film 35 to be electrically connected to contact layer 30.

Light absorption layer 40 includes, for example, a plurality of well layers and barrier layers, and has a multi quantum well structure (MQW). The well layers and the barrier layers are formed of, for example, undoped gallium indium arsenide phosphide (i-GaInAsP) or aluminum gallium indium arsenide (i-AlGaInAs). N-type cladding layer 16, light absorption layer 40 of the MQW, and p-type cladding layer 20 are stacked to form a p-i-n structure including mesa 43 in the Z-axis direction. Resin layers 44 are formed of, for example, benzocyclobutene (BCB) or the like. Electrode 48 is formed of a metal such as a stacked body of Ti/Pt/Au.

As illustrated in FIG. 1B, light absorption layer 40 in modulator region 50, waveguide layer 54 in waveguide region 52, and active layer 18 in light emitting region 10 are disposed in the X-axis direction. Waveguide layer 54 in waveguide region 52 is formed of, for example, InGaAsP, and is optically coupled to active layer 18 and light absorption layer 40. Waveguide layer 54 is disposed between cladding layer 16 and cladding layer 20 in the Z-axis direction.

No contact layer 30 is disposed in waveguide region 52. Contact layer 30 and electrode 48 in modulator region 50 are insulated from contact layer 30 and electrode 38 in light emitting region 10 by insulating films 34 and 35. Electrode 36 is disposed in light emitting region 10, waveguide region 52, and modulator region 50. Protrusions and recesses extending in the X-axis direction are periodically disposed in a portion of diffraction grating layer 14 within light emitting region 10. The protrusions and recesses function as a diffraction grating 15. The diffraction grating may be disposed in active layer 18.

FIG. 3 illustrates a cross section including active layer 18, light absorption layer 40, and waveguide layer 54. As illustrated in FIG. 3, a portion of mesa 43 in waveguide region 52 has tapered portions 43a and 43b. Specifically, tapered portions 43a and 43b are formed in diffraction grating layer 14, cladding layers 16 and 20, and waveguide layer 54. Tapered portion 43a of the two tapered portions is located near light emitting region 10 and is tapered from modulator region 50 toward light emitting region 10 along the X-axis direction. Tapered portion 43b is located near modulator region 50 and is tapered from light emitting region 10 toward modulator region 50 along the X-axis direction. An inclination angle of each of tapered portions 43a and 43b with respect to the X-axis direction is, for example, 10° or less.

In the X-axis direction, resin layers 44 extend from an end portion of semiconductor optical device 100 to a vicinity of the center of tapered portion 43b. A width W3 of buried layer 32 between resin layer 44 and light absorption layer 40 is, for example, 0.3 µm.

By injecting a current into active layer 18 in light emitting region 10 using electrodes 38 and 36, light is emitted in the X-axis direction. An oscillation wavelength is controlled to, for example, 1550 nm by diffraction grating 15. Since a band gap of waveguide layer 54 is larger than the energy of the light, waveguide layer 54 hardly absorbs the light. By applying a voltage to light absorption layer 40 in modulator region 50 using electrodes 48 and 36, an absorbance of light absorption layer 40 is changed to modulate the light. The modulated light is emitted from the end face of semiconductor optical device 100. Since tapered portion 43b is disposed, coupling between light emitting region 10 and modulator region 50 is strengthened, and loss of light is suppressed. Since tapered portion 43a is disposed, return of light from modulator region 50 to light emitting region 10 is suppressed.

As illustrated in FIG. 2A, in light emitting region 10, since p-type buried layer 24, n-type buried layer 26, and p-type cladding layer 28 are stacked, the current is blocked by buried layer 26 and is less likely to flow in the Z-axis direction through buried layers 26 and 24. On the other hand, p-type cladding layers 20 and 28 are stacked on active layer 18, and n-type cladding layer 16 is disposed under active layer 18. By performing effective current confinement using the pn buried structure and selectively injecting a current to active layer 18 through cladding layer 28, the high output can be achieved.

Figure 4:
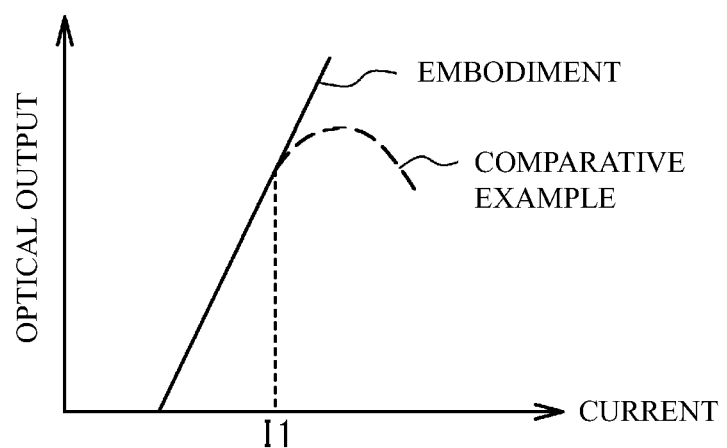
FIG. 4 is a schematic diagram illustrating characteristics of the semiconductor optical device.

FIG. 4 is a schematic diagram illustrating characteristics of semiconductor optical devices. The horizontal axis represents a current inputted to light emitting region 10, and the vertical axis represents an optical output. A solid line represents the characteristics of the semiconductor optical device according to the embodiment. A broken line represents the characteristics of a semiconductor optical device according to a comparative example. In the comparative example, semi-insulating buried layer 32 is disposed in both light emitting region 10 and modulator region 50, and buried layers 24 and 26 are not disposed in light emitting region 10.

The optical output increases as the current increases. However, in the comparative example, the optical output does not linearly increase when the current becomes equal to or greater than I1, and the optical output decreases when the current further increases. Current confinement by semi-insulating buried layer 32 is insufficient, resulting in current leakage, and making an efficient current injection difficult. At temperatures higher than room temperature (about 25° C.), such as 75° C. for example, a decrease in optical output is likely to occur.

On the other hand, in the embodiment, the optical output increases linearly even when the current is at I1 or above. The pn buried structure formed by buried layers 24 and 26 enables stronger current confinement than buried layer 32, thereby increasing the optical output. For example, it is possible to perform high output operation even at high temperatures and obtain high optical output.

As illustrated in FIG. 2B, in modulator region 50, semi-insulating buried layer 32 is disposed on each of two sides of mesa 43. A parasitic capacitance of modulator region 50 is lower than that of light emitting region 10 having the pn buried structure, and the high speed modulation is possible.

(Manufacturing Method)

Referring to FIGS. 5A to 18C, a method of manufacturing semiconductor optical device 100 will be described. FIGS. 5A, 6, 7A, 8A, 9A, 10A, 11A, 12A and 13A are plan views illustrating the method of manufacturing semiconductor optical device 100. FIGS. 14A, 15A, 16A, 17A and 18A are perspective views illustrating the method of manufacturing semiconductor optical device 100. FIGS. 5B, 7B, 8B, 9B, 10B, 11B, 12B and 13B are cross-sectional views taken along line D-D of the corresponding plan views. FIGS. 7C, 8C, 9C, 10C, 11C, 12C and 13C are cross-sectional views taken along line E-E in the corresponding plan views. FIGS. 14B, 15B, 16B, 17C and 18C are cross-sectional views taken along line C-C in the corresponding perspective views. FIGS. 17B and 18B are cross-sectional views taken along line B-B in the corresponding perspective views. In the perspective views, inclination that may occur on surfaces of buried layers or the like is omitted, and the surfaces are illustrated as a plane.

Figure 5A:
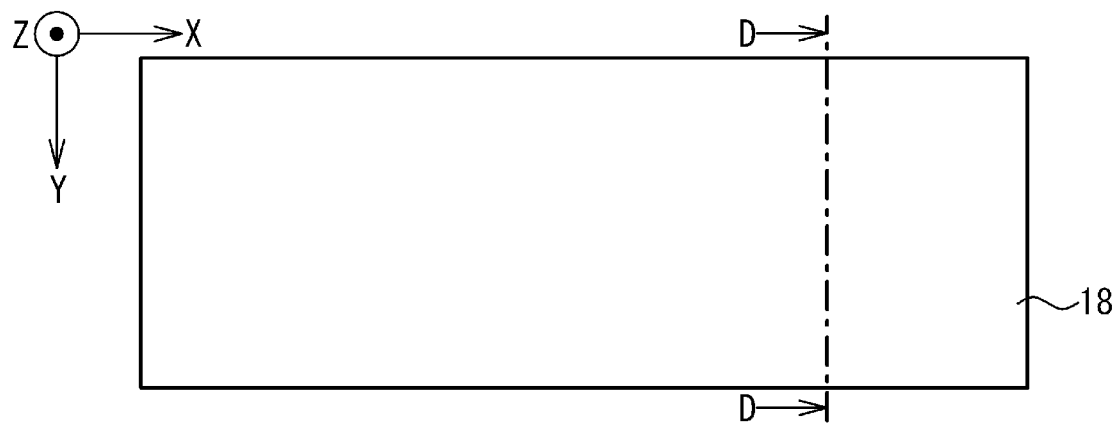
FIG. 5A is a plan view illustrating a method of manufacturing a semiconductor optical device.
Figure 5B:
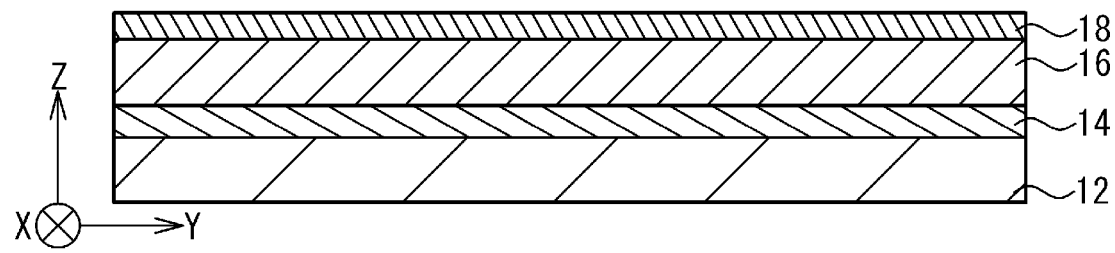
FIG. 5B is a cross-sectional view taken along line D-D in FIG. 5A.

As illustrated in FIGS. 5A and 5B, diffraction grating layer 14, cladding layer 16, and active layer 18 are sequentially epitaxially grown on substrate 12 by an organometallic vapor phase epitaxy method or the like.

Figure 6:
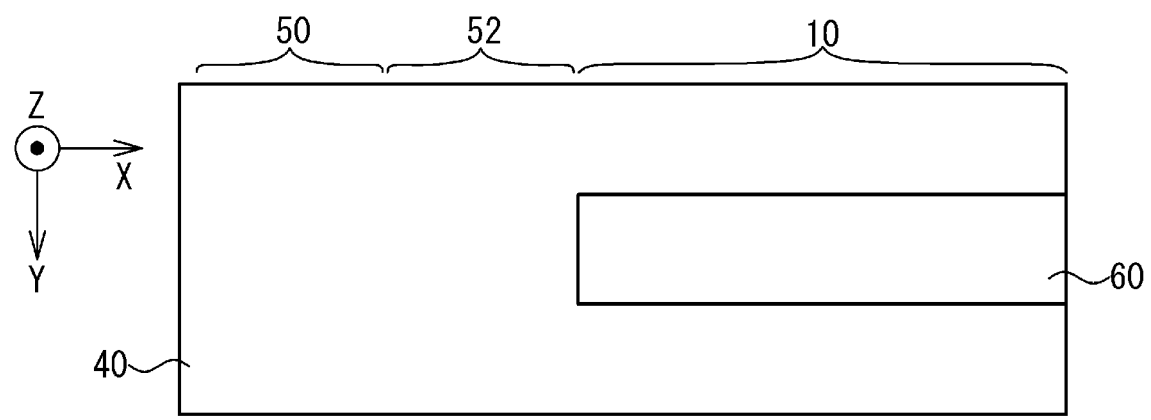
FIG. 6 is a plan view illustrating a method of manufacturing the semiconductor optical device.

As illustrated in FIG. 6, mask 60 formed of, for example, silicon oxide (SiO$_2$) is disposed on active layer 18. A portion of active layer 18 to be mesa 13 in light emitting region 10 is covered with mask 60. A portion of active layer 18 exposed from mask 60 is removed by etching, and light absorption layer 40 and waveguide layer 54 are epitaxially grown after the etching. Each thickness of light absorption layer 40 and waveguide layer 54 is equal to the thickness of active layer 18. Thereafter, mask 60 is removed, and a p-InP cladding layer 20 (not illustrated in FIG. 6) is grown.

Figure 7A:
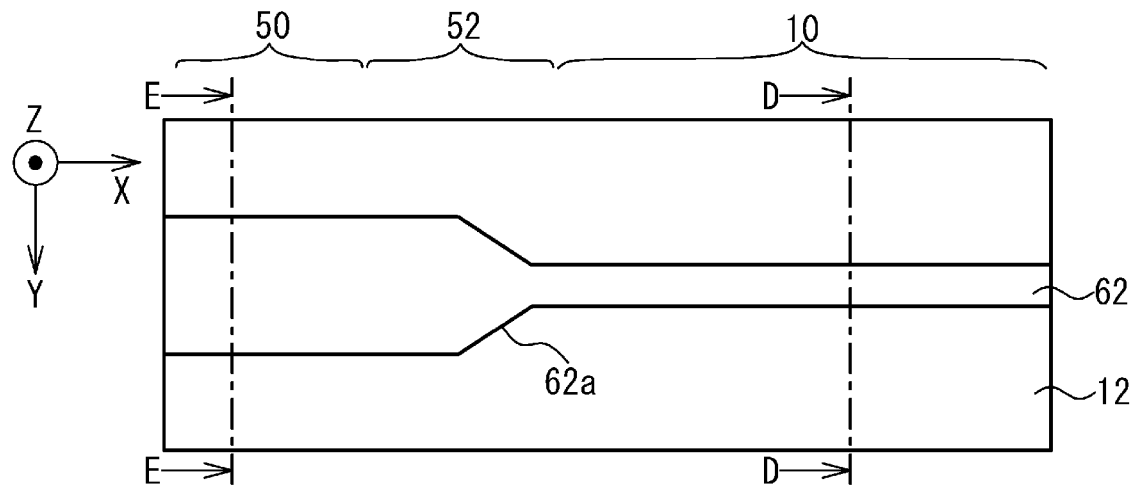
FIG. 7A is a plan view illustrating a method of manufacturing the semiconductor optical device.
Figure 7B:
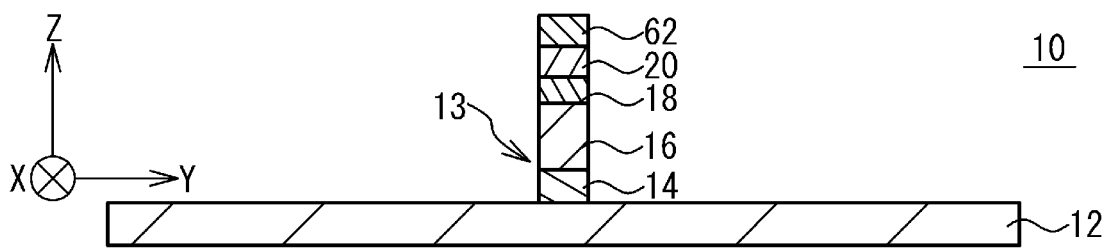
FIG. 7B is a cross-sectional view taken along line D-D in FIG. 7A.
Figure 7C:
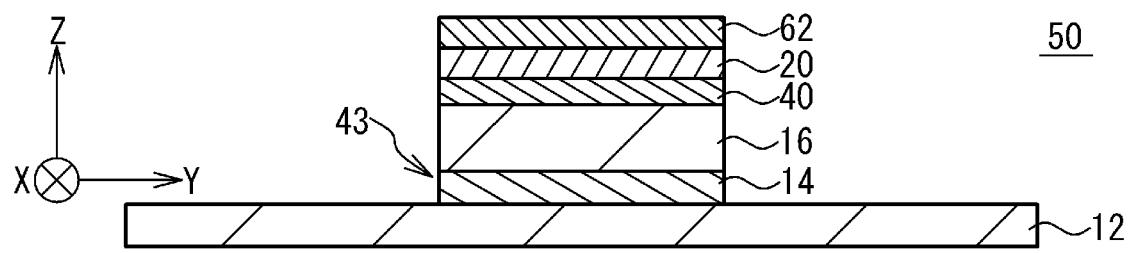
FIG. 7C is a cross-sectional view taken along line E-E in FIG. 7A.

As illustrated in FIGS. 7A to 7C, a mask 62 is disposed on cladding layer 20. Mask 62 extends from one end to the other end of substrate 12 in the X-axis direction and covers the central portion of cladding layer 20 in the Y-axis direction. A width in the Y-axis direction of mask 62 in modulator region 50 is, for example, 10 and a width in the Y-axis direction of mask 62 in light emitting region 10 is, for example, from 1 µm to 2 µm, inclusive. The width of mask 62 gradually decreases from modulator region 50 toward light emitting region 10. That is, mask 62 has a tapered portion 62a that is tapered in the X-axis direction (e.g. +X direction). Portions of diffraction grating layer 14, cladding layers 16 and 20, active layer 18 and light absorption layer 40 which are exposed from mask 62 are removed by etching. The etching is, for example, dry etching such as a reactive ion etching (RIE), or wet etching. As illustrated in FIG. 7B, mesa 13 is formed in light emitting region 10. As illustrated in FIG. 7C, mesa 43 is formed in modulator region 50. Substrate 12 is exposed on both sides of each of mesa 13 and 43. The width of mesa 43 is greater than the width of mesa 13. Tapered portion 62a of mask 62 is transferred to mesa 43 to form tapered portion 43a in FIG. 3.

Figure 8A:
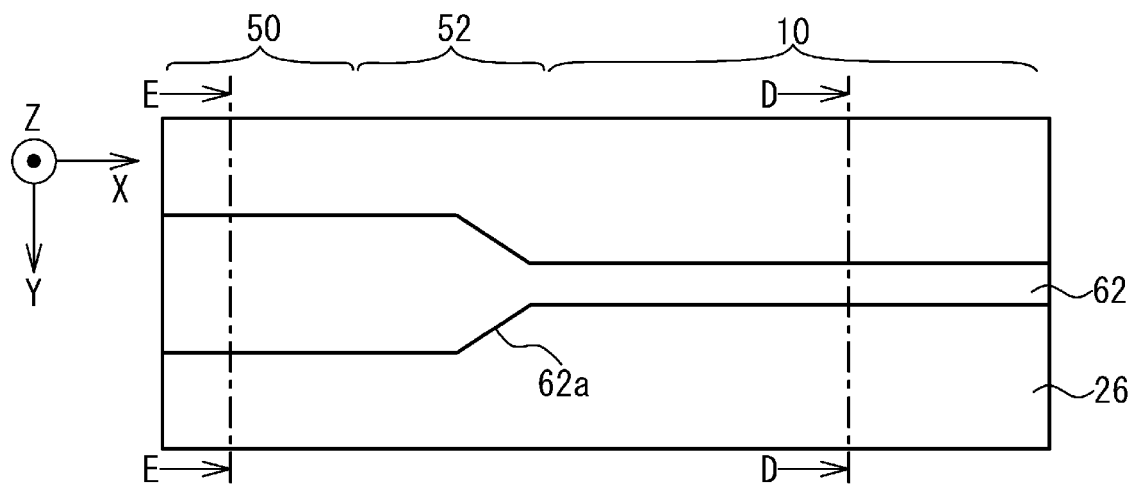
FIG. 8A is a plan view illustrating a method of manufacturing the semiconductor optical device.
Figure 8B:
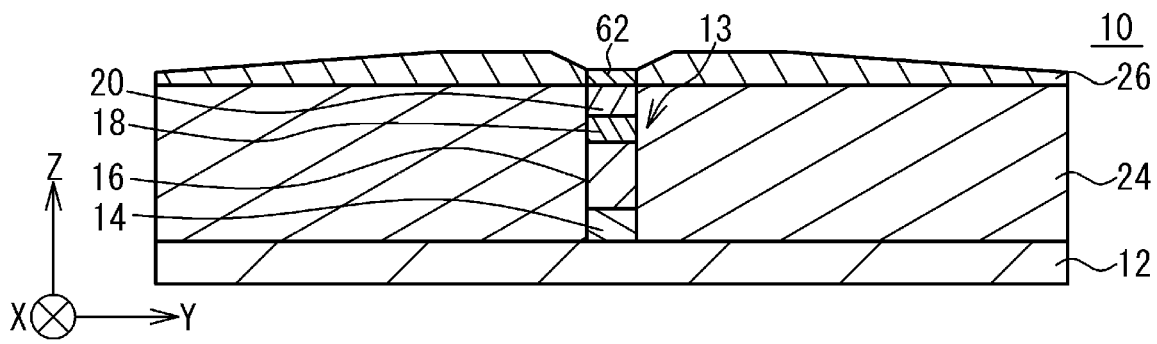
FIG. 8B is a cross-sectional view taken along line D-D in FIG. 8A.
Figure 8C:
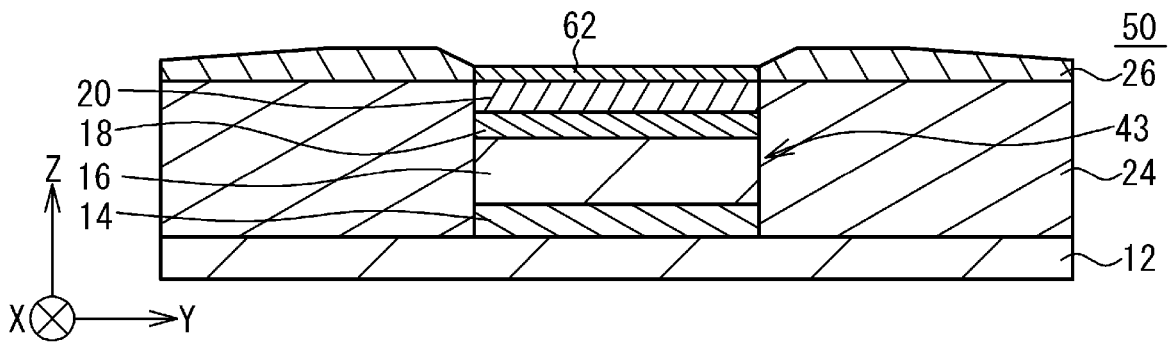
FIG. 8C is a cross-sectional view taken along line E-E in FIG. 8A.

As illustrated in FIGS. 8A to 8C, buried layers 24 and 26 are epitaxially grown in order on a surface of substrate 12 which is exposed from mask 62 by, for example, an OMVPE method. P—InP buried layer 24 is grown by introducing a p-type dopant into a growth apparatus together with source gases. The dopant is switched to an n-type dopant to grow n-InP buried layer 26. After the growth, mask 62 is removed.

Figure 9A:
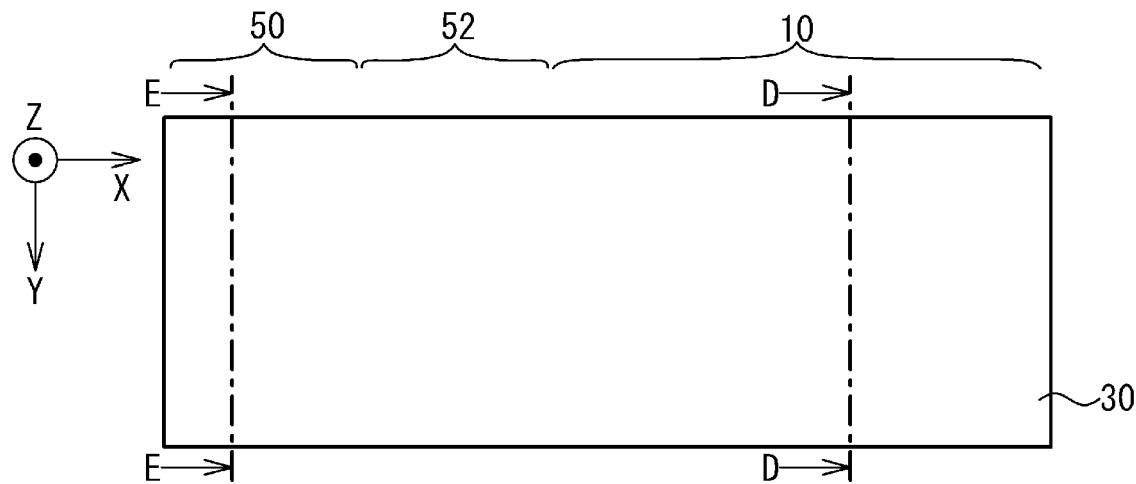
FIG. 9A is a plan view illustrating a method of manufacturing the semiconductor optical device.
Figure 9B:
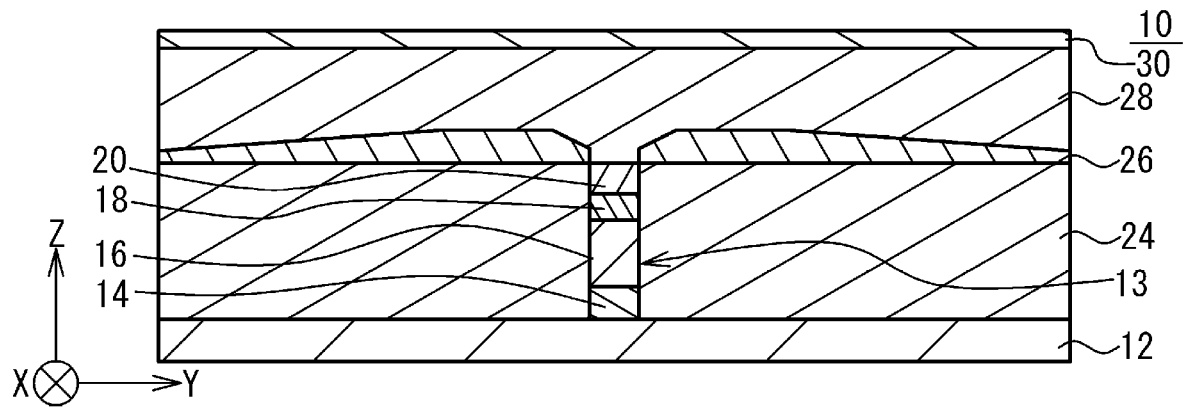
FIG. 9B is a cross-sectional view taken along line D-D in FIG. 9A.
Figure 9C:
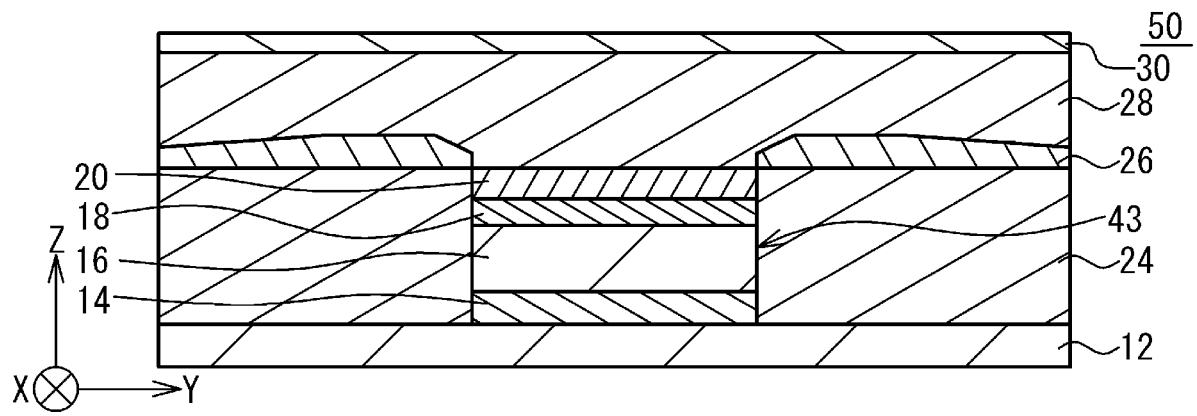
FIG. 9C is a cross-sectional view taken along line E-E in FIG. 9A.

As illustrated in FIGS. 9A to 9C, cladding layer 28 and contact layer 30 are epitaxially grown in order on mesas 13 and 43, and buried layer 26 by, for example, the OMVPE method.

Figure 10A:
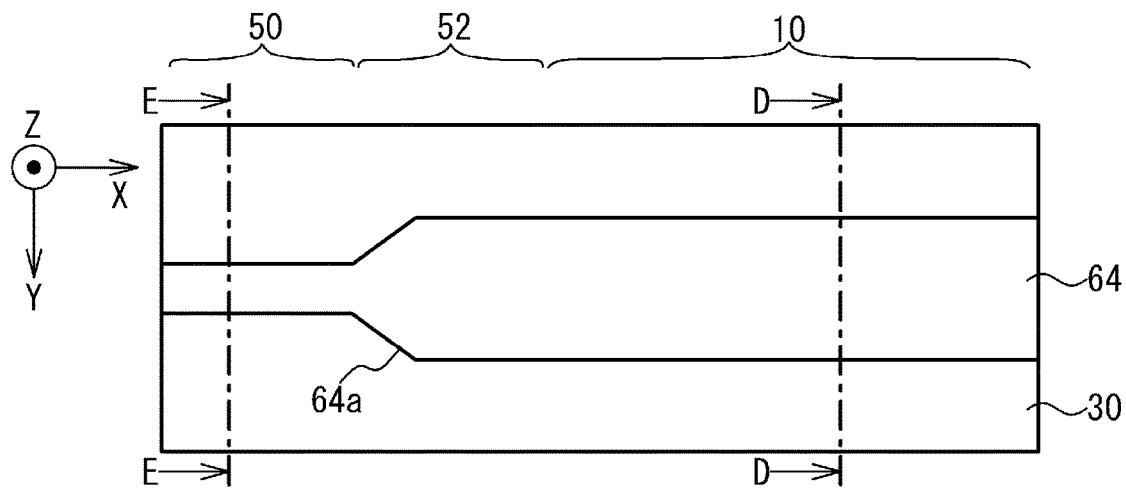
FIG. 10A is a plan view illustrating a method of manufacturing the semiconductor optical device.
Figure 10B:
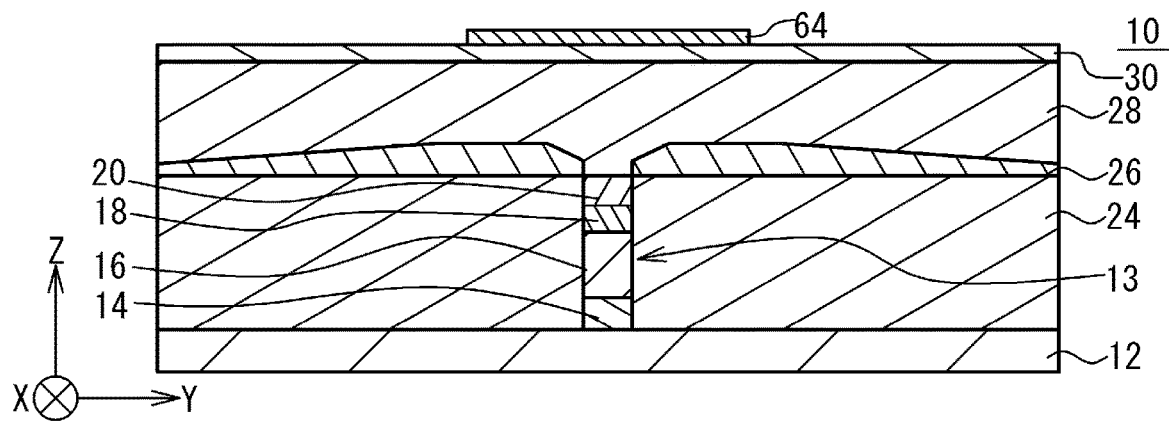
FIG. 10B is a cross-sectional view taken along line D-D in FIG. 10A.
Figure 10C:
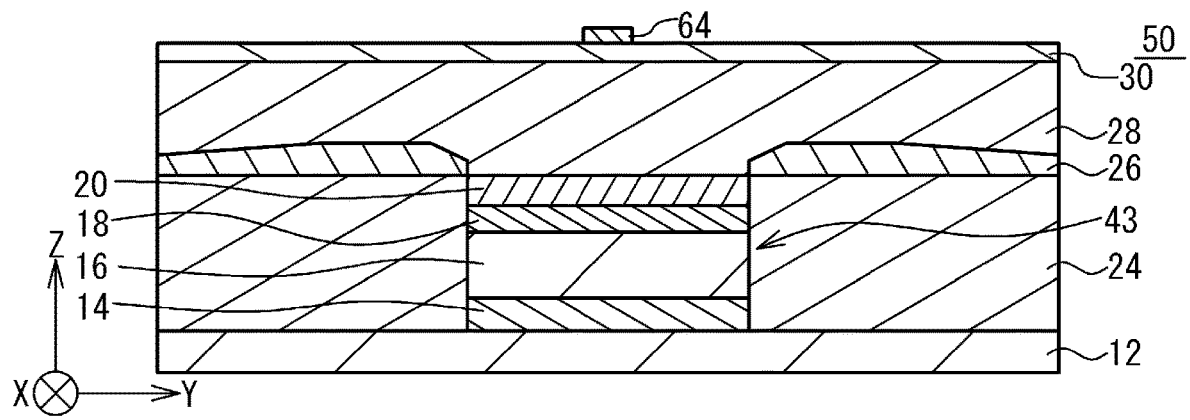
FIG. 10C is a cross-sectional view taken along line E-E in FIG. 10A.

As illustrated in FIGS. 10A to 10C, a mask 64 is disposed on contact layer 30. As illustrated in FIG. 10A, the width of mask 64 gradually decreases from light emitting region 10 toward modulator region 50, and, for example, is 10 µm in light emitting region 10, and 1 µm to 2 µm in modulator region 50. That is, mask 64 has a tapered portion 64a that is tapered in the X-axis direction (e.g. −X direction). As illustrated in FIG. 10B, the width of mask 64 is greater than the width of mesa 13. As illustrated in FIG. 10C, the width of mask 64 is less than the width of mesa 43.

Figure 11A:
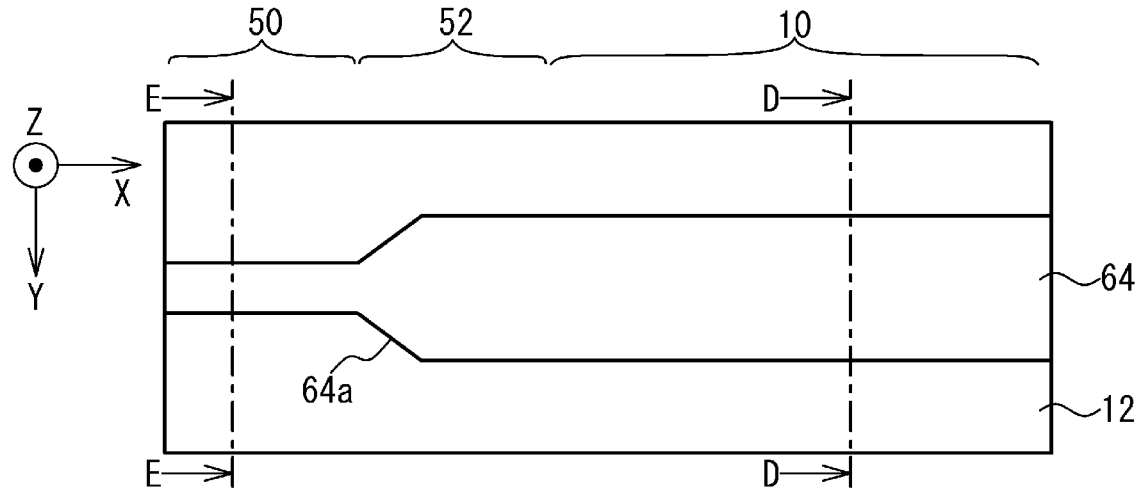
FIG. 11A is a plan view illustrating a method of manufacturing the semiconductor optical device.
Figure 11B:
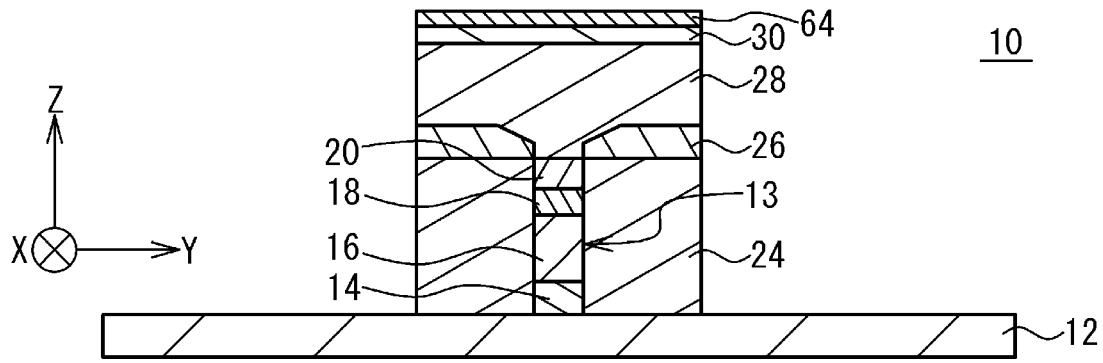
FIG. 11B is a cross-sectional view taken along line D-D in FIG. 11A.
Figure 11C:
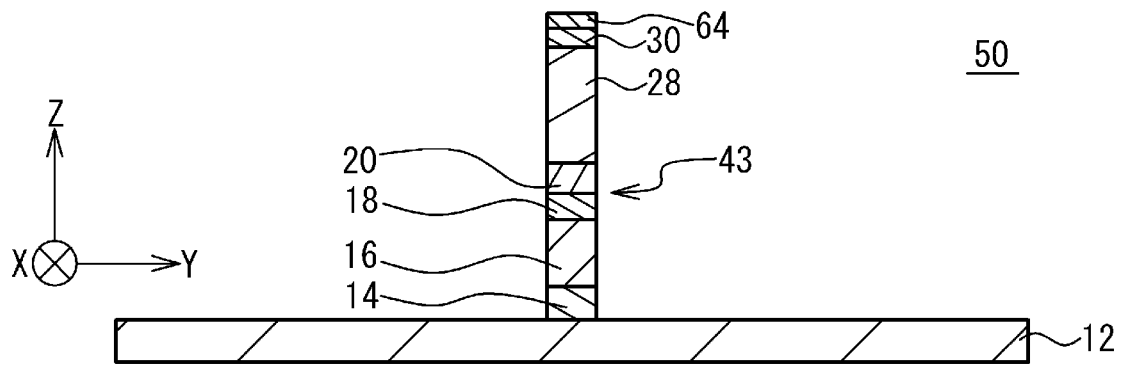
FIG. 11C is a cross-sectional view taken along line E-E in FIG. 11A.

As illustrated in FIGS. 11A to 11C, portions of buried layers 24 and 26, cladding layer 28, and contact layer 30 that are exposed from mask 64 are removed by etching. As illustrated in FIG. 11B, since the width of mask 64 is greater than the width of mesa 13, buried layers 24 and 26 remain on both sides of mesa 13. Cladding layer 28 and contact layer 30 remain on mesa 13 and buried layer 26. As illustrated in FIG. 11C, mesa 43 is narrowed, and buried layers 24 and 26, cladding layer 28, and contact layer 30 are removed from both sides of mesa 43. Cladding layer 28 and contact layer 30 remain on mesa 43. Tapered portion 64a of mask 64 is transferred to mesa 43 to form tapered portion 43b in FIG. 3.

Figure 12A:
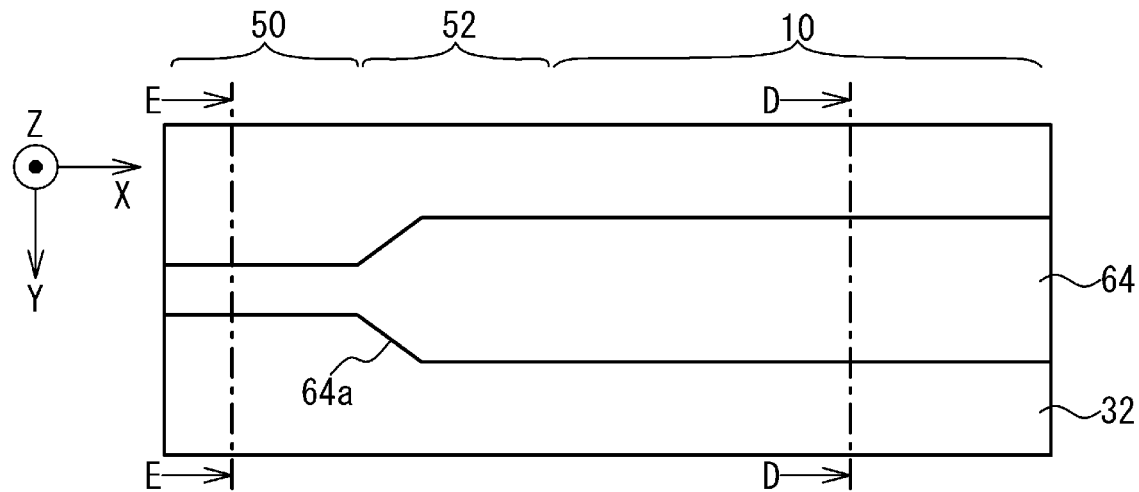
FIG. 12A is a plan view illustrating a method of manufacturing the semiconductor optical device.
Figure 12B:
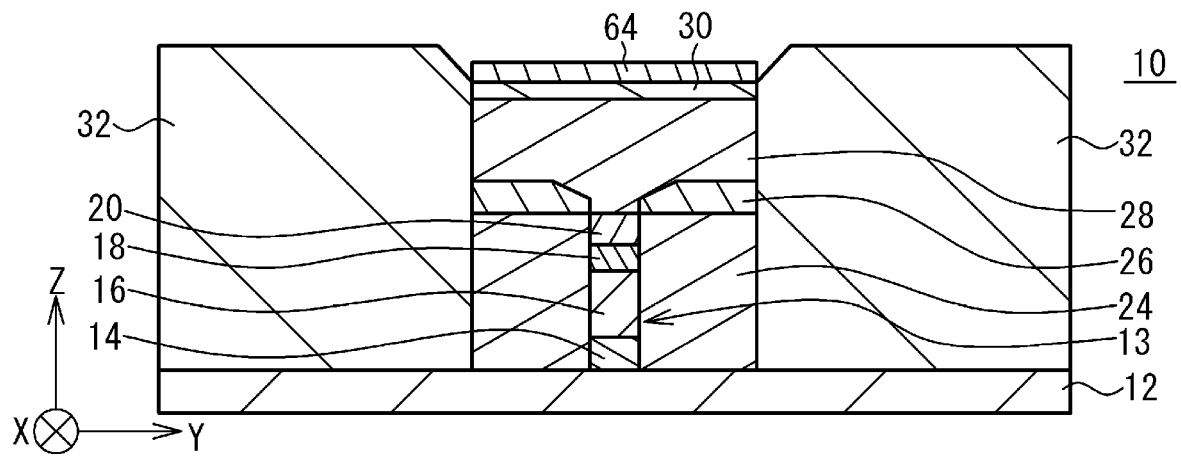
FIG. 12B is a cross-sectional view taken along line D-D in FIG. 12A.
Figure 12C:
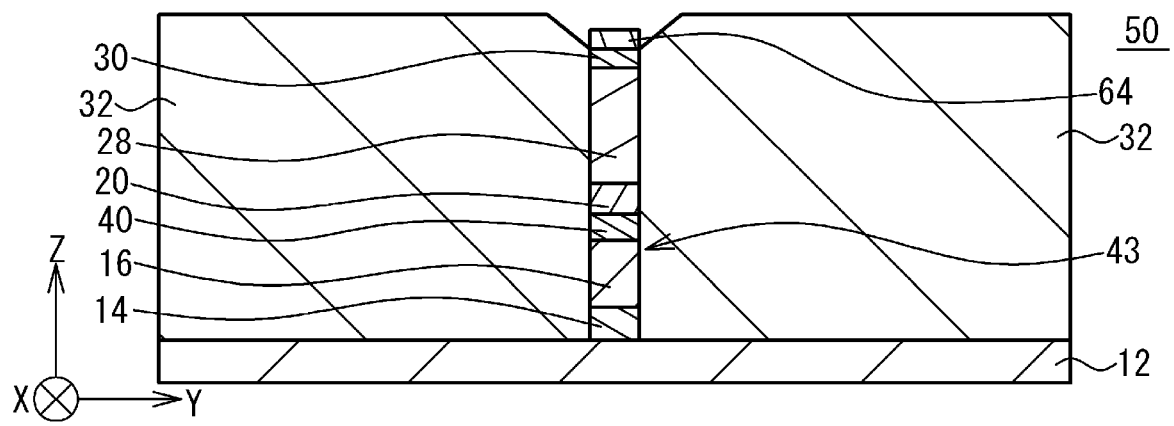
FIG. 12C is a cross-sectional view taken along line E-E in FIG. 12A.

As illustrated in FIGS. 12A to 12C, semi-insulating buried layer 32 is epitaxially grown on a surface of substrate 12 which is exposed from mask 64. As illustrated in FIG. 12B, in the Y-axis direction, buried layer 32 is located on each of two sides of mesa 13 and outside buried layers 24 and 26, cladding layer 28, and contact layer 30. As illustrated in FIG. 12C, buried layer 32 is disposed on each of two sides of mesa 43. After the formation of buried layer 32, mask 64 is removed.

Figure 13A:
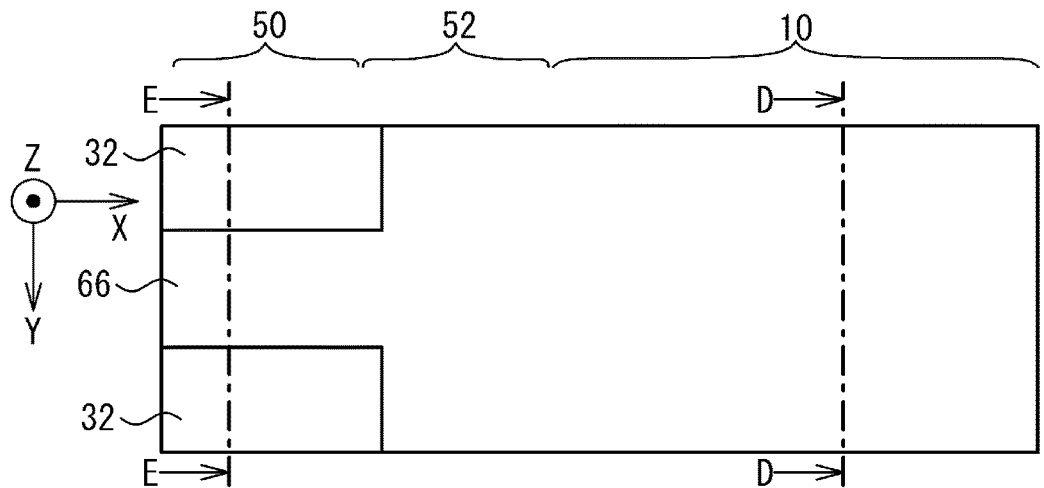
FIG. 13A is a plan view illustrating a method of manufacturing the semiconductor optical device.
Figure 13B:
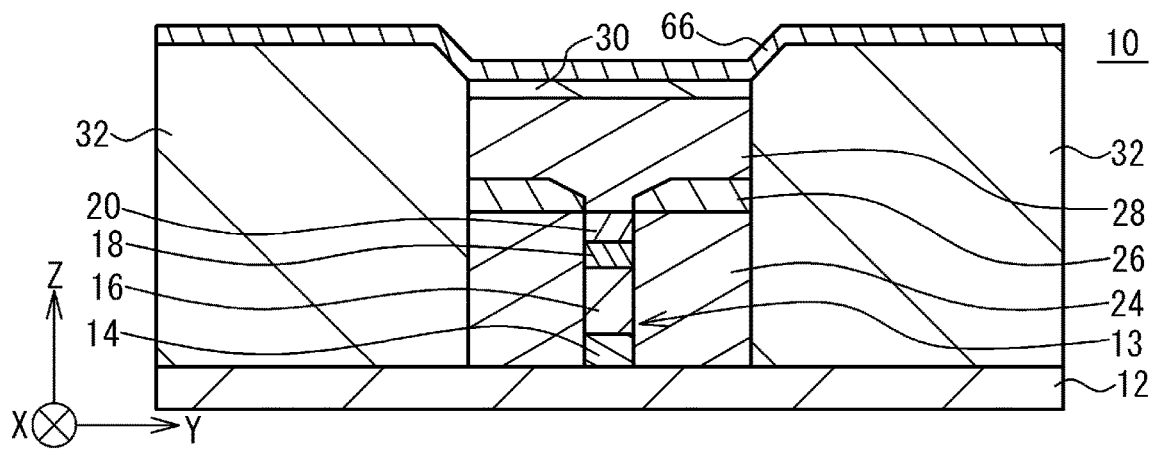
FIG. 13B is a cross-sectional view taken along line D-D in FIG. 13A.
Figure 13C:
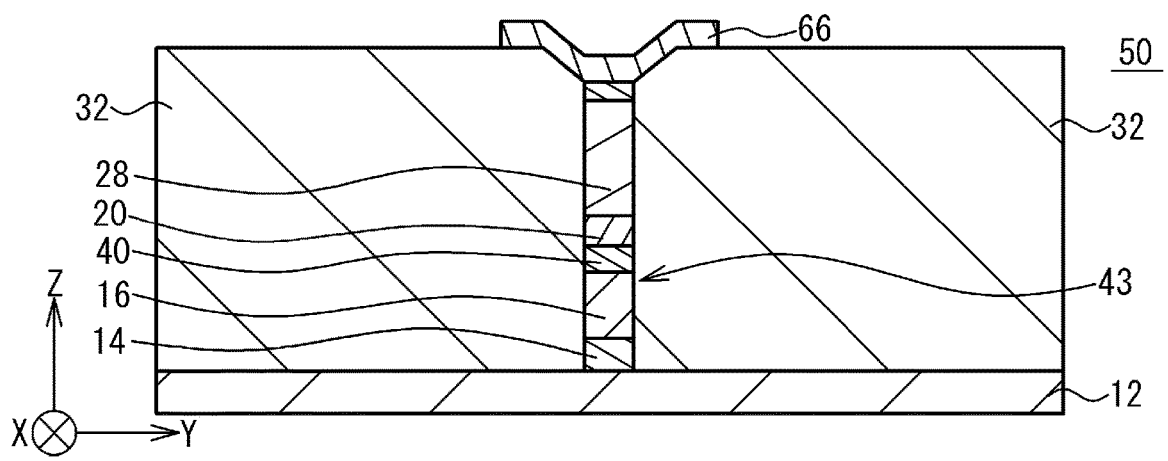
FIG. 13C is a cross-sectional view taken along line E-E in FIG. 13A.

As illustrated in FIGS. 13A to 13C, mask 66 is disposed. As illustrated in FIG. 13B, mask 66 covers the entire light emitting region 10. As illustrated in FIG. 13C, mask 66 covers the entire mesa 43 and a portion of buried layer 32. An upper surface of buried layer 32 outside the covered portion in the Y-axis direction is exposed from mask 66.

Figure 14A:
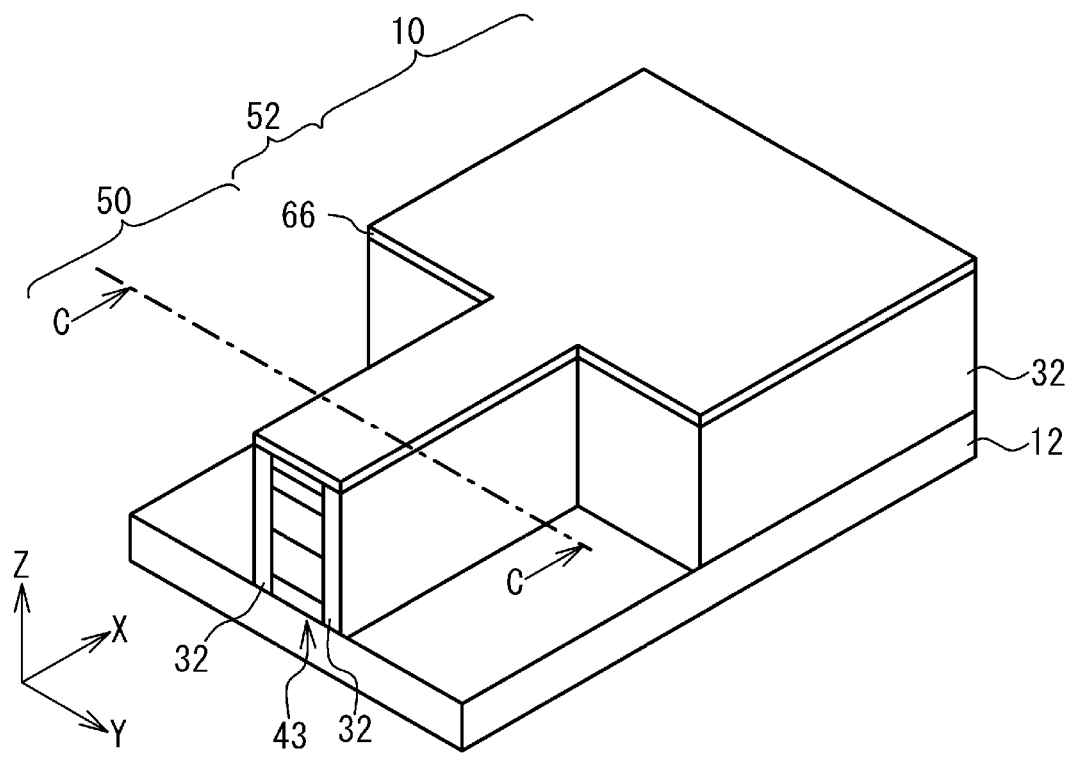
FIG. 14A is a perspective view illustrating a method of manufacturing the semiconductor optical device.
Figure 14B:
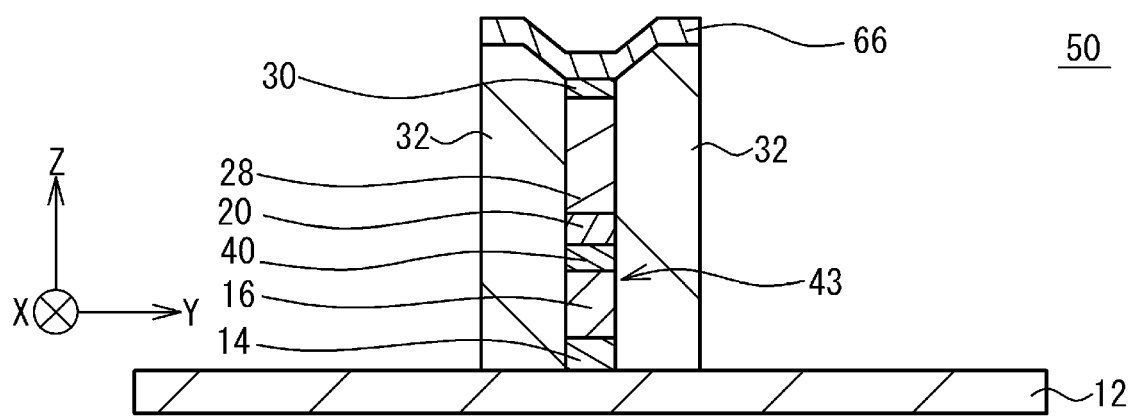
FIG. 14B is a cross-sectional view taken along line C-C in FIG. 14A.

As illustrated in FIGS. 14A and 14B, etching is performed to remove a portion of buried layer 32 outside the portion covered with mask 66 in the Y-axis direction. The portion of the buried layer 32 covered with mask 66 remains. The upper surface of substrate 12 and the side surfaces of buried layer 32 are exposed by etching. After the etching, mask 66 is removed.

Figure 15A:
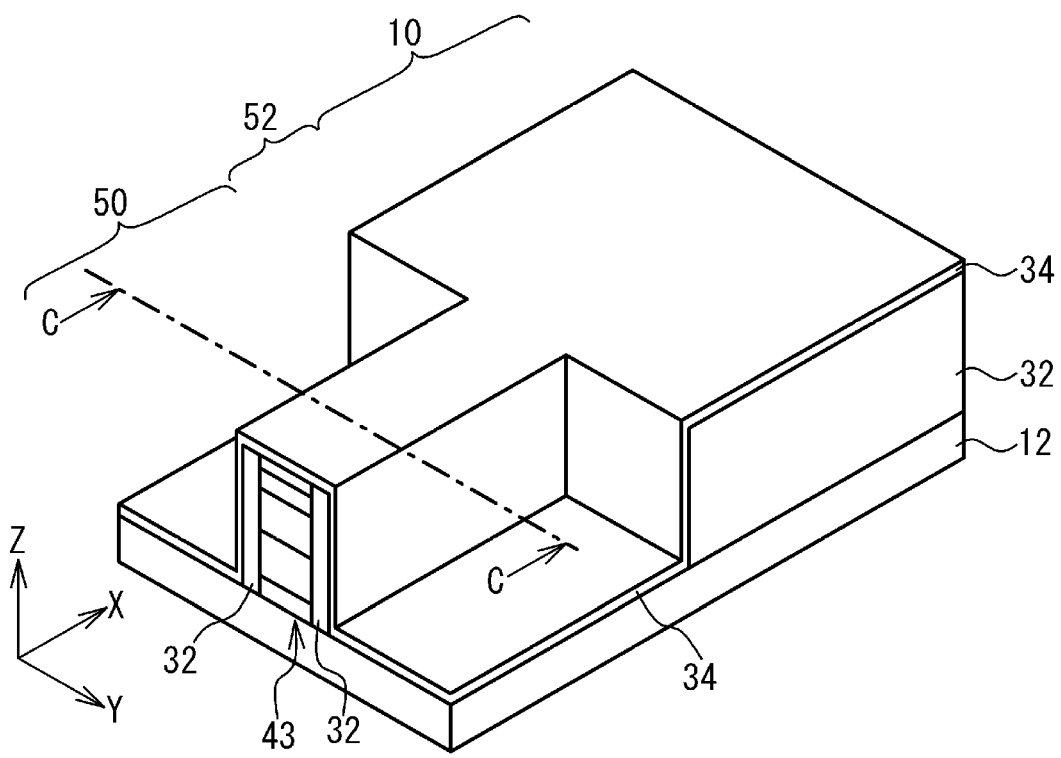
FIG. 15A is a perspective view illustrating a method of manufacturing the semiconductor optical device.
Figure 15B:
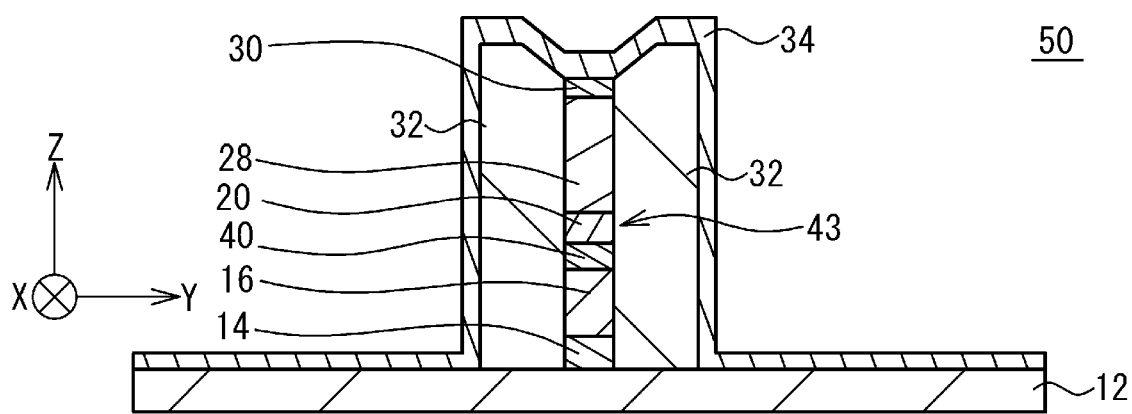
FIG. 15B is a cross-sectional view taken along line C-C in FIG. 15A.

As illustrated in FIGS. 15A and 15B, insulating film 34 is disposed on the upper surface of contact layer 30, the upper and side surfaces of buried layer 32, and the upper surface of substrate 12 by a chemical vapor deposition (CVD) method, for example. Mask 66 may be used as a part of insulating film 34 without being removed.

Figure 16A:
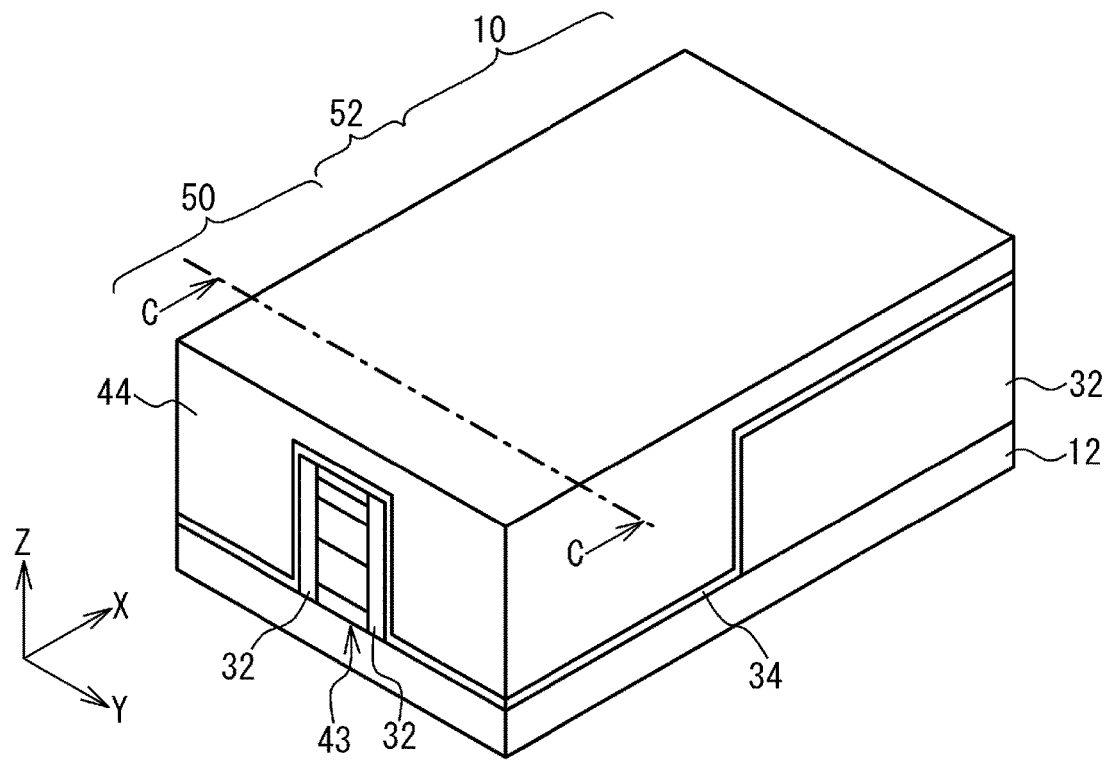
FIG. 16A is a perspective view illustrating a method of manufacturing the semiconductor optical device.
Figure 16B:
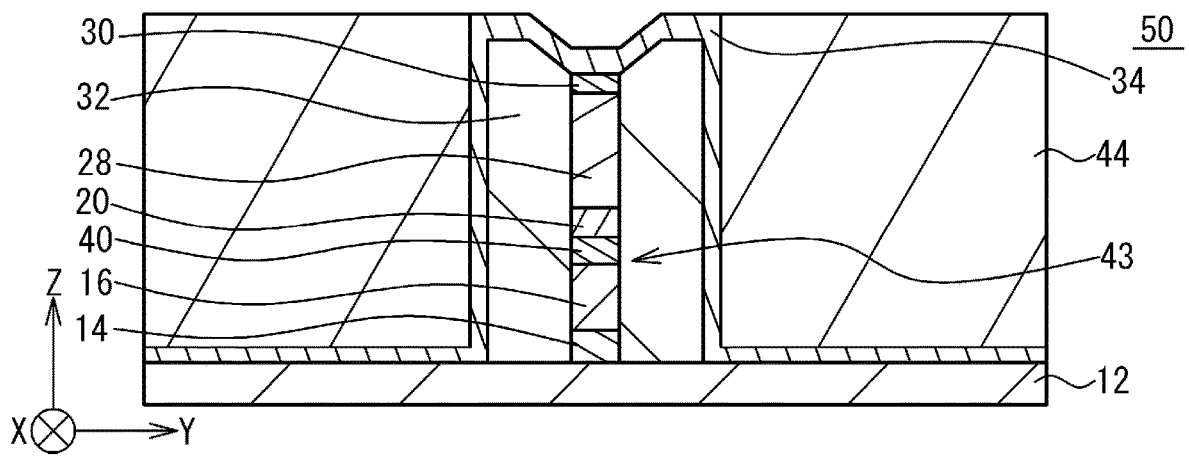
FIG. 16B is a cross-sectional view taken along line C-C in FIG. 16A.

As illustrated in FIGS. 16A and 16B, resin layer 44 is disposed on the upper and side surfaces of insulating film 34. As illustrated in FIG. 16B, both sides of mesa 43 and buried layers 32 are embedded with resin layer 44.

Figure 17A:
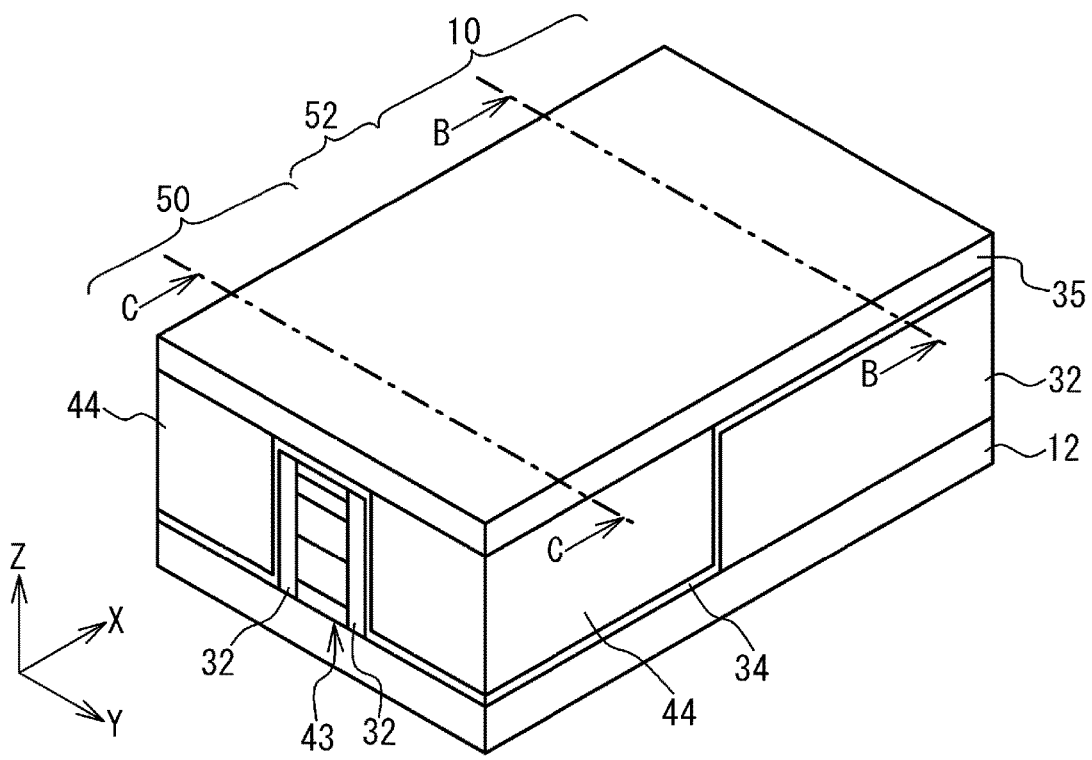
FIG. 17A is a perspective view illustrating a method of manufacturing the semiconductor optical device.
Figure 17B:
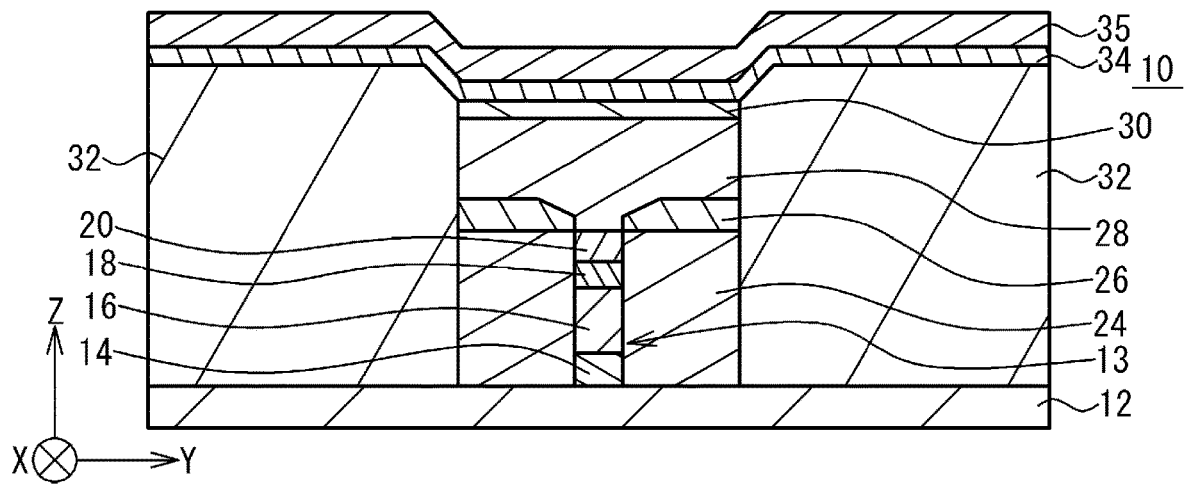
FIG. 17B is a cross-sectional view taken along line B-B in FIG. 17A.
Figure 17C:
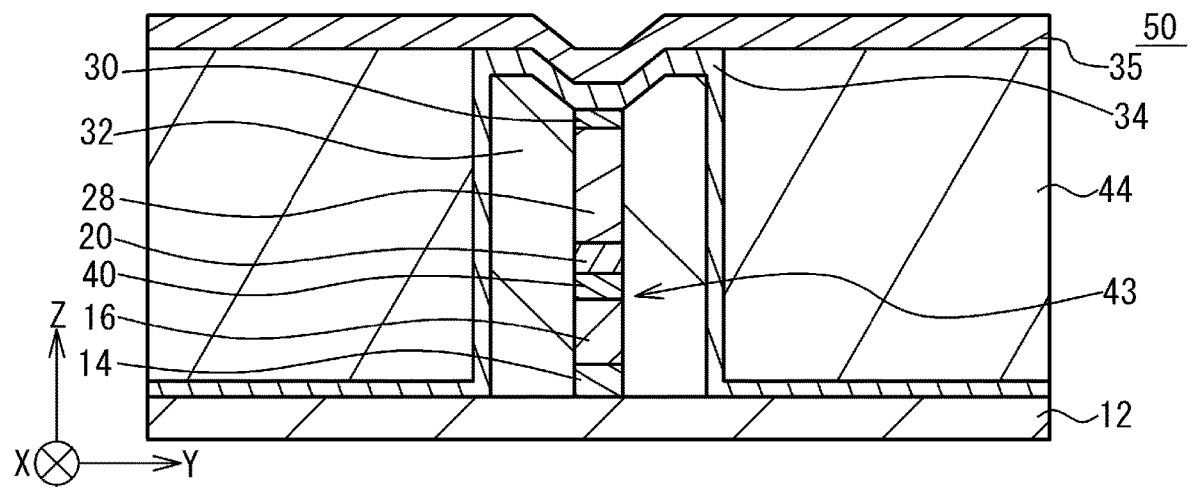
FIG. 17C is a cross-sectional view taken along line C-C in FIG. 17A.

As illustrated in FIG. 17A, an upper portion of resin layer 44 is removed by, for example, polishing or the like so that the upper surface of resin layer 44 and the upper surface of insulating film 34 in light emitting region 10 have substantially the same height. Thereafter, a portion of contact layer 30 between light emitting region 10 and modulator region 50 is removed by etching or the like to insulate light emitting region 10 and modulator region 50 (see FIG. 1B). As illustrated in FIGS. 17A to 17C, insulating film 35 is disposed on the upper surfaces of resin layer 44 and insulating film 34.

Figure 18A:
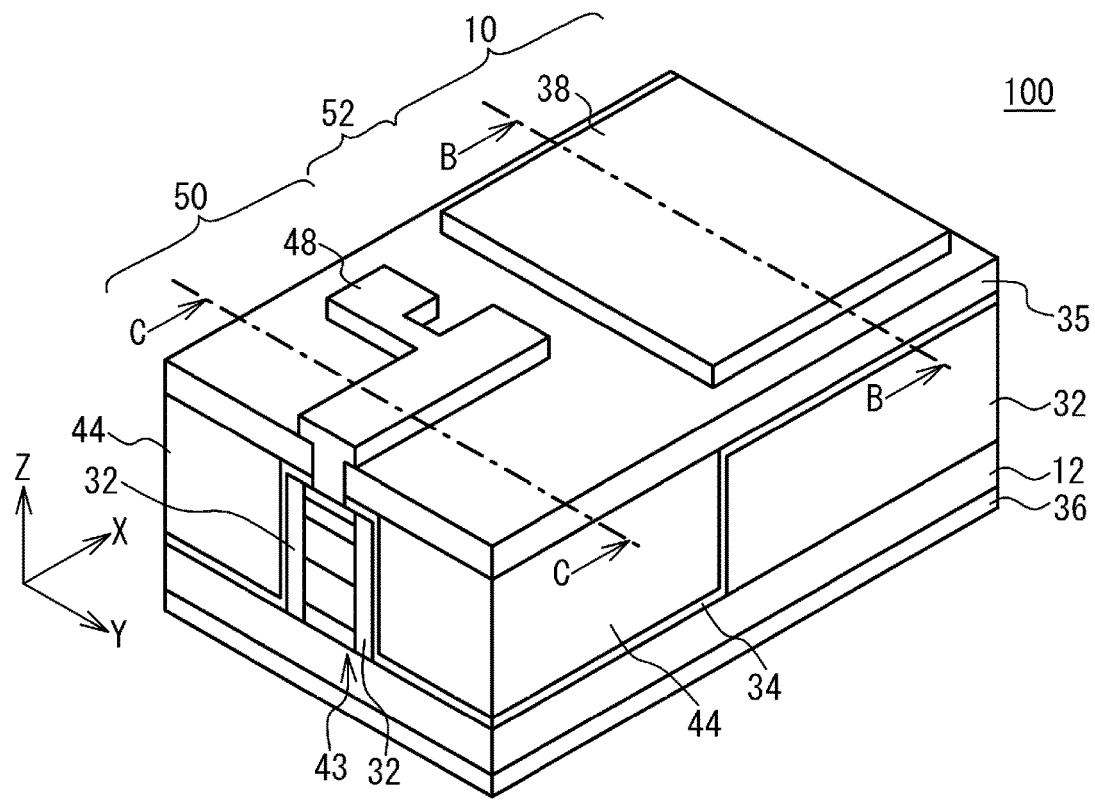
FIG. 18A is a perspective view illustrating a method of manufacturing the semiconductor optical device.
Figure 18B:
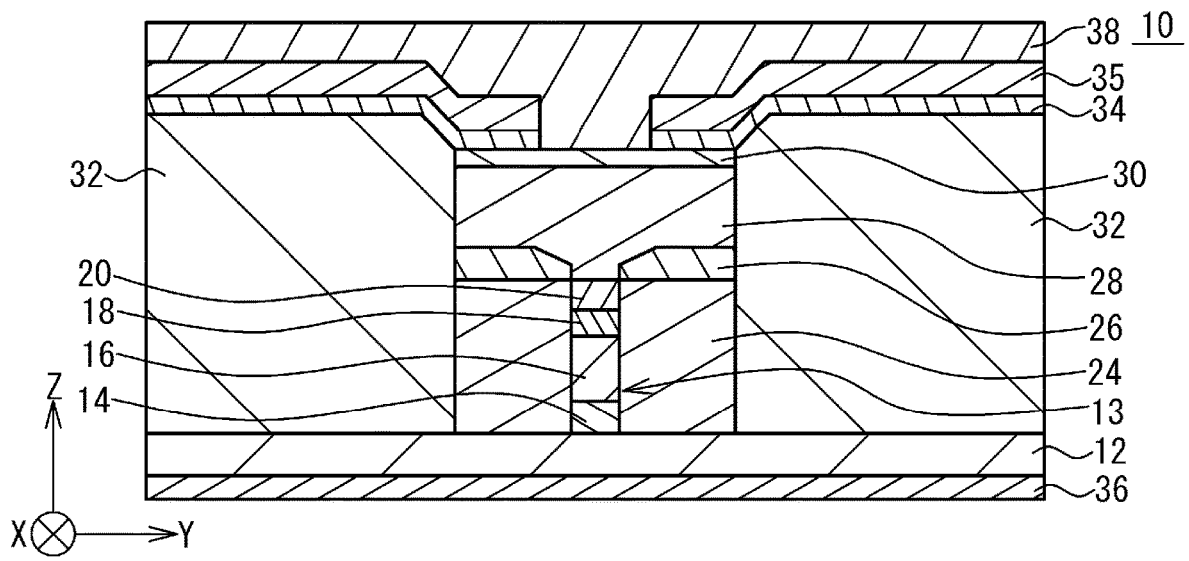
FIG. 18B is a cross-sectional view taken along line B-B in FIG. 18A.
Figure 18C:
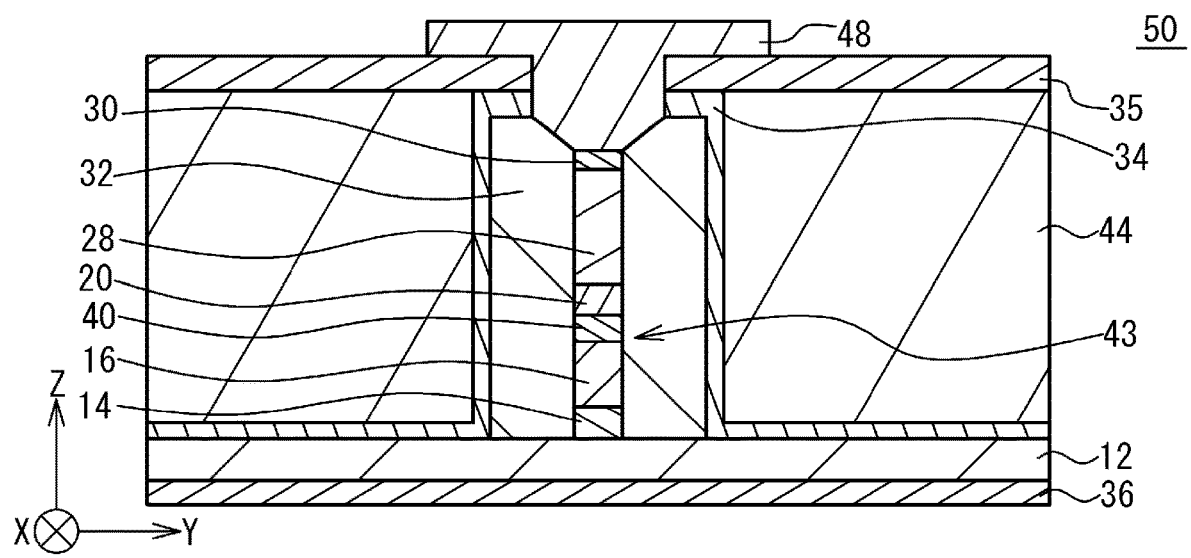
FIG. 18C is a cross-sectional view taken along line C-C in FIG. 18A.

As illustrated in FIG. 18A, electrodes 36, 38 and 48 are disposed. As illustrated in FIGS. 18B and 18C, openings are provided in insulating films 34 and 35 by resist patterning and etching or the like. Electrodes 38 and 48 are disposed on insulating film 35 by vapor deposition or the like, and electrode 36 is disposed on a lower surface of substrate 12. Through the above steps, semiconductor optical device 100 is formed.

According to the present embodiment, as illustrated in FIG. 2A, mesa 13 including active layer 18 is disposed in light emitting region 10. A current is injected into active layer 18 through p-type cladding layer 28. By the pn buried structure in which p-type buried layer 24 and n-type buried layer 26 are stacked on each of two sides of mesa 13, current leakage to the buried layer is suppressed and current confinement can be enhanced. The high optical output can be obtained by selectively injecting the current into active layer 18 of mesa 13. In particular, as illustrated in FIG. 4, good characteristics can be achieved even at high temperatures and at high output. For example, semiconductor optical device 100 can be used for optical communications in data centers or the like.

As illustrated in FIG. 2B, semi-insulating buried layer 32 is disposed on each of two sides of mesa 43 including light absorption layer 40 in modulator region 50. Since the parasitic capacitance of modulator region 50 is lower than that of light emitting region 10, the high speed modulation is possible. According to the embodiment, both of the high output and the high speed modulation can be achieved.

As illustrated in FIGS. 2A and 2B, n-type cladding layer 16 is disposed under active layer 18 and light absorption layer 40, and p-type cladding layer 20 and 28 are disposed on active layer 18 and light absorption layer 40, respectively. The p-i-n structure including active layer 18 is formed in mesa 13 of light emitting region 10. On the other hand, the pn buried structure in which p-type buried layer 24 and n-type buried layer 26 are stacked is disposed on each of two sides of mesa 13. Therefore, the current can be intensively injected into active layer 18. The p-i-n structure including light absorption layer 40 is formed in mesa 43 of modulator region 50. Semi-insulating buried layer 32 is disposed on each of two sides of mesa 43. The parasitic capacitance can be reduced and a voltage can be applied to light absorption layer 40. Both of the high output and the high speed modulation can be achieved.

As illustrated in FIG. 2B, resin layer 44 is disposed on each of two sides of mesa 43. Since the parasitic capacitance can be further reduced by resin layer 44, light modulation can be performed at a higher speed.

Buried layer 24, cladding layers 20 and 28 are formed of p-InP. Substrate 12, buried layer 24, and cladding layer 16 are formed of n-InP. A pn buried structure can be formed of InP. Buried layer 32 is formed of semi-insulating InP doped with Fe, which can reduce the parasitic capacitance. Compound semiconductors other than InP may be used for these layers. A p-type layer and an n-type layer may be alternately stacked, and the stacking order may be reversed from that in the embodiment.

As illustrated in FIG. 11C, after removing buried layers 24 and 26 on each of two sides of mesa 43 and narrowing mesa 43, buried layer 32 is disposed on each of two sides of mesa 43 as illustrated in FIG. 12C. Since buried layer 32 is formed without the pn buried structure remaining on each of two sides of mesa 43, the parasitic capacitance can be effectively reduced.

In the step illustrated in FIGS. 7B and 7C, the width of mesa 13 is smaller than that of mesa 43. In the step illustrated in FIG. 11C, mesa 43 in modulator region 50 is processed to be as thin as mesa 13. In this step, tapered portions 43a and 43b illustrated in FIG. 3 are formed. A slight positional deviation of, for example, several μm or less may occur between mesa 13 and mesa 43 of modulator region 50. Tapered portions 43a and 43b can enhance optical coupling between light emitting region 10 and modulator region 50, and suppress return of light from modulator region 50 to light emitting region 10. The inclination angle of each of tapered portions 43a and 43b with respect to the X-axis direction is, for example, 5° or more and 10° or less. Abnormal growth of the buried layers can be suppressed.

In FIG. 3, one end of waveguide layer 54 in the X-axis direction is located at the distal end of tapered portion 43b, and the other end of waveguide layer 54 protrudes toward light emitting region 10 from the distal end of tapered portion 43a by about 5 μm, for example. One end of waveguide layer 54 may protrude from the distal end of tapered portion 43b toward modulator region 50 or may be located on light emitting region 10. The other end of waveguide layer 54 may be located at the same position as the distal end of tapered portion 43a or may be located closer to modulator region 50 than the distal end of tapered portion 43a.

Diffraction grating 15 is disposed in diffraction grating layer 14 of Mesa 13. Light emitting region 10 functions as a DFB laser. Diffraction grating 15 may be disposed in a layer other than diffraction grating layer 14. Light emitting region 10 may function as a laser other than the DFB laser. Modulator region 50 may function as a modulator other than the EA modulator.

Embodiments according to the present disclosure have been described above. However, the present invention is not limited to the embodiment described above, and various modifications and changes can be made to the present invention within the scope of the gist described in the claims.

What is claimed is:

1. A semiconductor optical device in which a light emitting region that emits light and a modulator region that modulates the light are integrated, the semiconductor optical device comprising:
    a first mesa that is disposed in the light emitting region, extends in a light propagation direction in which the light propagates, protrudes in a first direction intersecting the light propagation direction, and includes an active layer;
    a first buried layer and a second buried layer that are disposed on each of two sides of the first mesa in a second direction intersecting the light propagation direction and are sequentially stacked in the first direction;
    a first semiconductor layer that is disposed on the first mesa and the second buried layer;
    a second mesa that is disposed in the modulator region, extends in the light propagation direction, protrudes in the first direction, and includes a light absorption layer;
    a third buried layer that is disposed on each of two sides of the second mesa; and
    a resin layer that is disposed on each of the two sides of the second mesa and outside of the third buried layer, wherein the first semiconductor layer and the first buried layer each have a first conductivity type, wherein the second buried layer has a second conductivity type different from the first conductivity type, and wherein the third buried layer is a semi-insulating semiconductor layer.

2. The semiconductor optical device according to claim 1, wherein the first mesa includes a second semiconductor layer and the active layer that are sequentially stacked, wherein the second mesa includes a third semiconductor layer, the light absorption layer, and a fourth semiconductor layer that are sequentially stacked, wherein the second semiconductor layer and the third semiconductor layer each have the second conductivity type, and wherein the fourth semiconductor layer has the first conductivity type.

3. The semiconductor optical device according to claim 1, wherein the first semiconductor layer and the first buried layer each include p-type indium phosphide, and wherein the second buried layer includes n-type indium phosphide.

4. The semiconductor optical device according to claim 1, wherein the third buried layer includes semi-insulating indium phosphide.

5. The semiconductor optical device according to claim 1, wherein the second mesa includes a first tapered portion tapered from the modulator region toward the light emitting region in the light propagation direction and a second tapered portion tapered from the light emitting region toward the modulator region in the light propagation direction.

6. The semiconductor optical device according to claim 1, wherein the first mesa includes a diffraction grating that extends in the light propagation direction.

7. A method of manufacturing a semiconductor optical device in which a light emitting region that emits light and a modulator region that modulates the light are integrated, the method comprising:

forming a first mesa in the light emitting region extending in a light propagation direction in which the light propagates, protruding in a first direction intersecting the light propagation direction, and includes an active layer;

sequentially stacking, in the first direction, a first buried layer and a second buried layer on each of two sides of the first mesa in a second direction intersecting the light propagation direction;

forming a first semiconductor layer on the first mesa and the second buried layer;

forming a second mesa including a light absorption layer in the modulator region, the second mesa extends in the light propagation direction and protrudes in the first direction;

disposing a third buried layer on each of two sides of the second mesa; and disposing a resin layer on each of the two sides of the second mesa and outside of the third buried layer, wherein the first semiconductor layer and the first buried layer each have a first conductivity type, wherein the second buried layer has a second conductivity type different from the first conductivity type, and wherein the third buried layer is a semi-insulating semiconductor layer.

8. The method of manufacturing the semiconductor optical device according to claim 7, wherein the forming the second mesa is forming the second mesa having a larger width than the first mesa, wherein the stacking the first buried layer and the second buried layer includes stacking the first buried layer and the second buried layer on each of the two sides of each of the first mesa and the second mesa, wherein the method of manufacturing further comprises removing the first buried layer and the second buried layer on each of the two sides of the second mesa and narrowing the second mesa, and wherein the disposing the third buried layer is disposing the third buried layer on each of the two sides of the second mesa after the narrowing the second mesa.

* * * * *